US008508987B2

(12) United States Patent
Tsuji et al.

(10) Patent No.: US 8,508,987 B2
(45) Date of Patent: Aug. 13, 2013

(54) SEMICONDUCTOR DEVICE

(75) Inventors: Takaharu Tsuji, Kawasaki (JP); Genta Watanabe, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 93 days.

(21) Appl. No.: 13/319,461

(22) PCT Filed: May 27, 2009

(86) PCT No.: PCT/JP2009/059648
§ 371 (c)(1),
(2), (4) Date: Nov. 8, 2011

(87) PCT Pub. No.: WO2010/137125
PCT Pub. Date: Dec. 2, 2010

(65) Prior Publication Data
US 2012/0051122 A1    Mar. 1, 2012

(51) Int. Cl.
*G11C 11/00*    (2006.01)

(52) U.S. Cl.
USPC ............. 365/158; 365/171; 257/421

(58) Field of Classification Search
USPC .............. 365/158, 171, 210, 157, 148, 173, 365/55, 66, 189.07, 233.5; 257/422, 421, 257/427
See application file for complete search history.

(56) References Cited

U.S. PATENT DOCUMENTS

2009/0032891 A1* 2/2009 Yen et al. ............... 257/421
2009/0250776 A1* 10/2009 Takenaga et al. ......... 257/421

FOREIGN PATENT DOCUMENTS

| JP | 2002-280526 A | 9/2002 |
| JP | 2003-318366 A | 11/2003 |
| JP | 2004-311942 A | 11/2004 |
| JP | 2006-032762 A | 2/2006 |
| JP | 2009-038221 A | 2/2009 |
| WO | WO 2007/046350 A1 | 4/2007 |

* cited by examiner

*Primary Examiner* — Dang Nguyen
(74) *Attorney, Agent, or Firm* — McDermott Will & Emery LLP

(57) ABSTRACT

A write disturbance margin of reference cells that generate reference current during read is improved. A bit line forms a clad interconnect structure in the normal cell region where normal cells are disposed, and a partially clad or non-clad interconnect structure in the reference cell region where a reference cell is disposed. Thus, a writing magnetic field intensity applied to the reference cell is smaller than the write magnetic field intensity applied to a normal memory cell during identical write currents.

12 Claims, 30 Drawing Sheets

FIG. 25
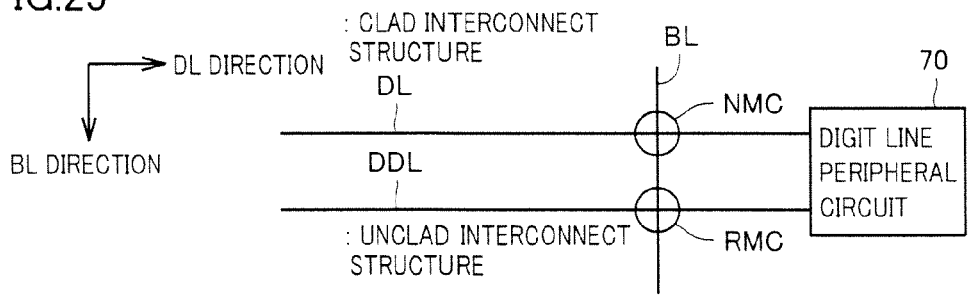
FIG. 26
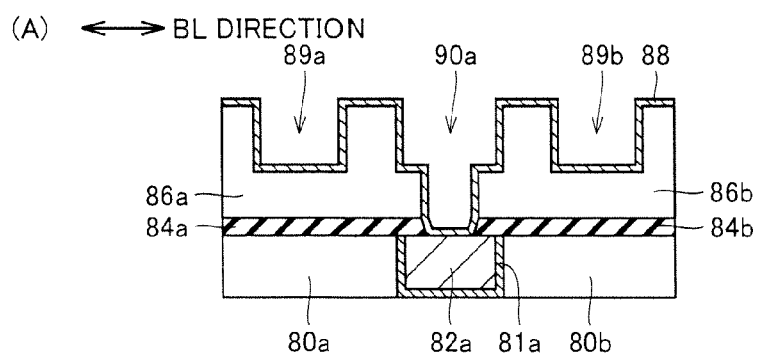
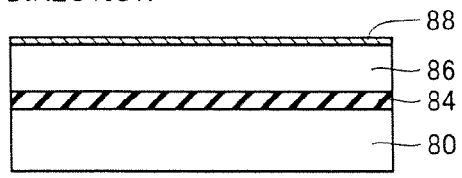
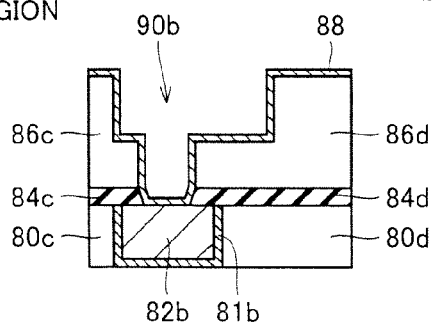

FIG. 27
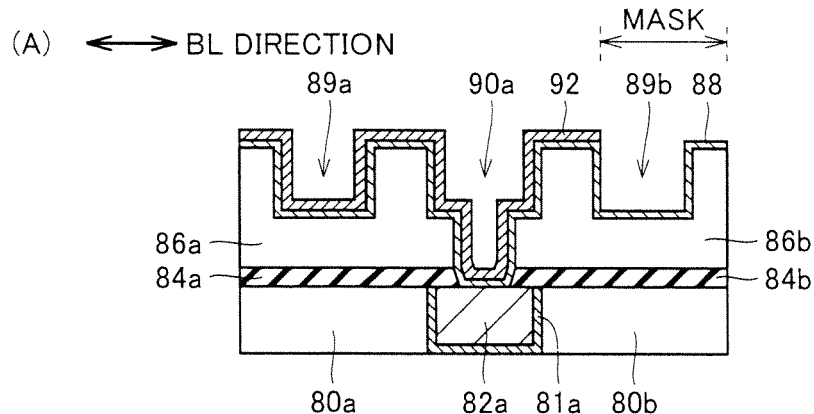
(A) ←→ BL DIRECTION
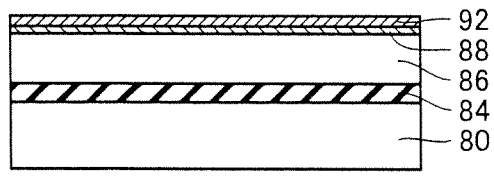
(B) ←→ DL DIRECTION
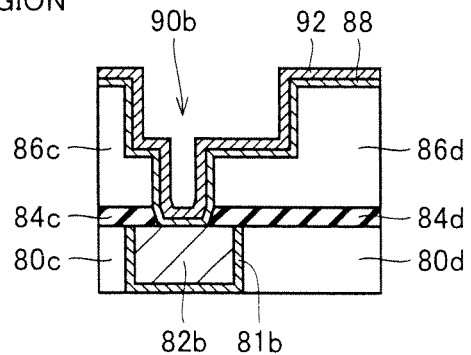
(C) : DL PERIPHERAL REGION ←→ BL DIRECTION FIG.29
(A) ⟷ BL DIRECTION
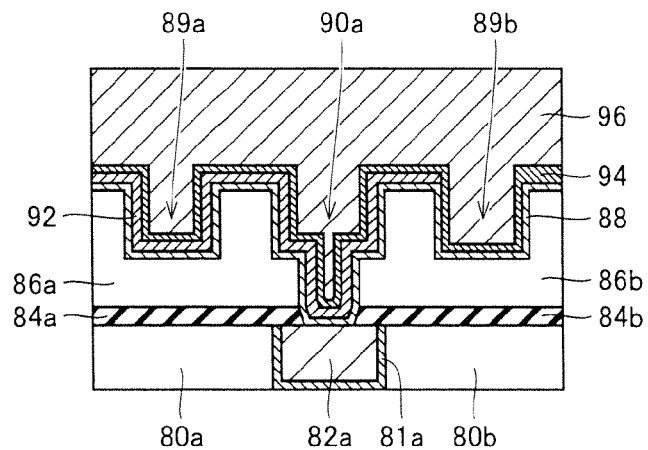
(B) ⟷ DL DIRECTION
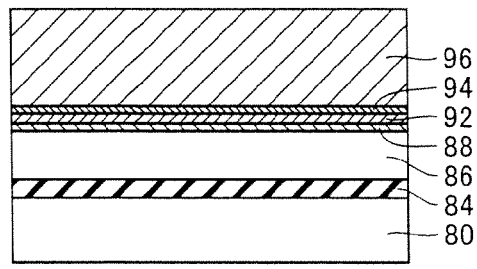
(C) : DL PERIPHERAL REGION ⟷ BL DIRECTION
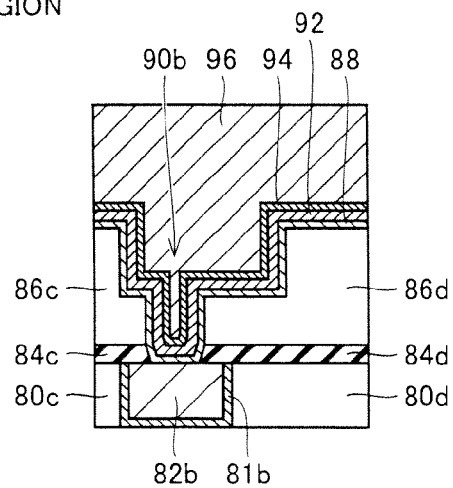

FIG.30
(A) ⟵⟶ BL DIRECTION
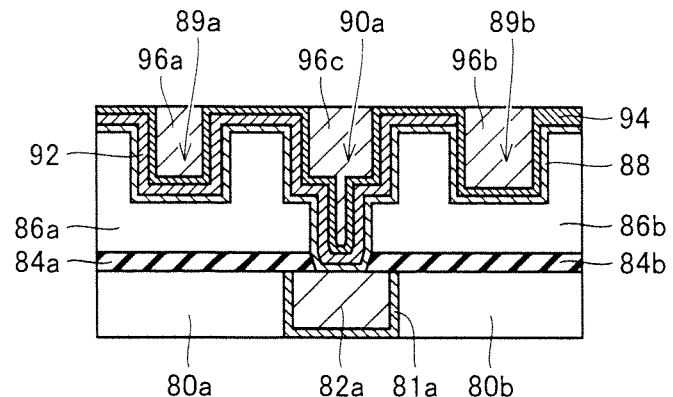
(B) ⟵⟶ DL DIRECTION
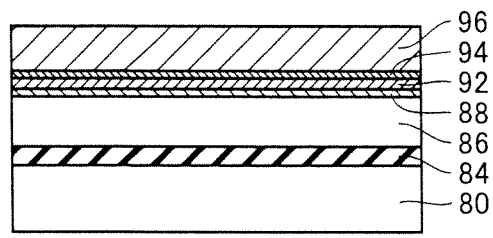
(C) : DL PERIPHERAL REGION  ⟵⟶ BL DIRECTION
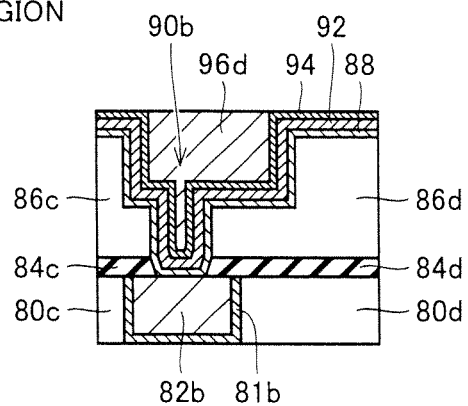

FIG. 31
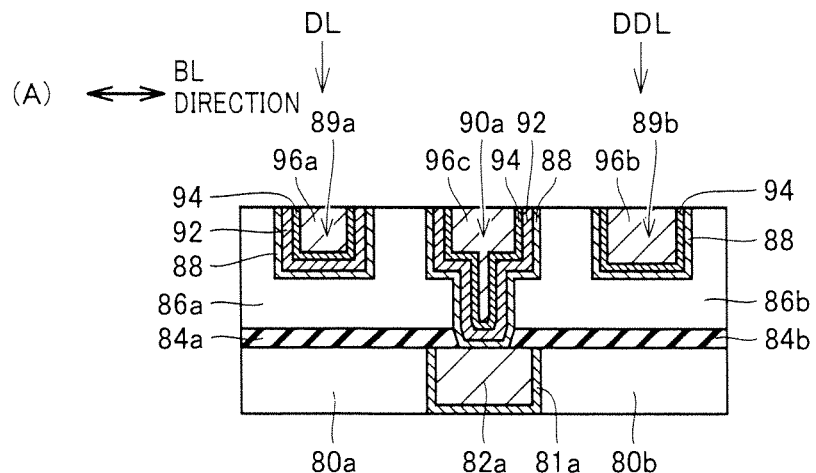
(A) ←→ BL DIRECTION
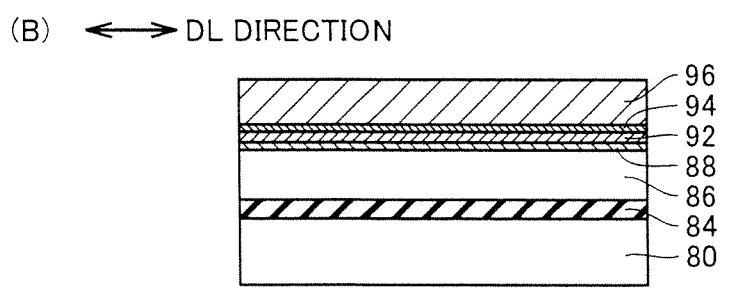
(B) ←→ DL DIRECTION
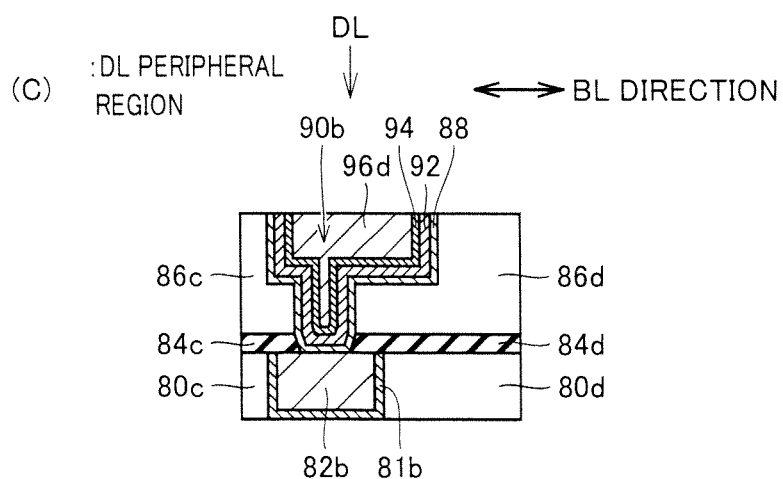
(C) : DL PERIPHERAL REGION FIG.32
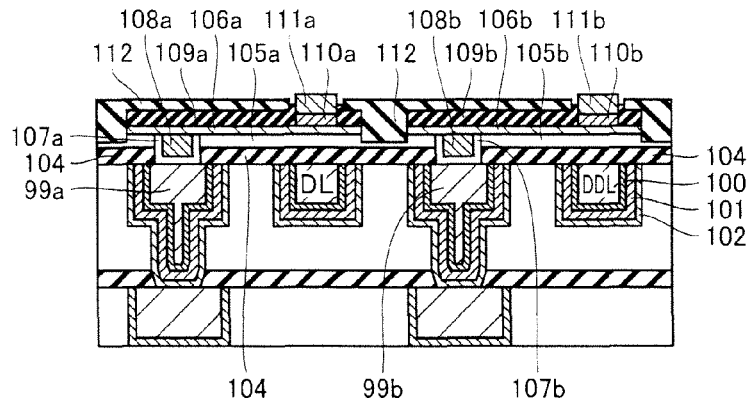
(A) ←→ BL DIRECTION
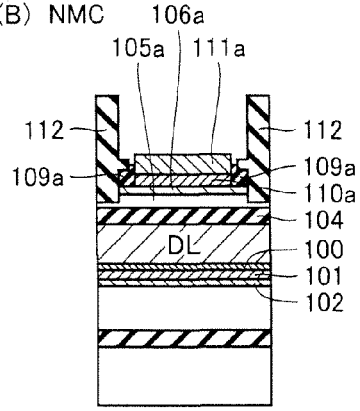
(B) NMC
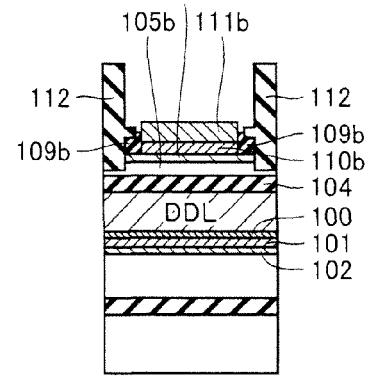
(C) RMC
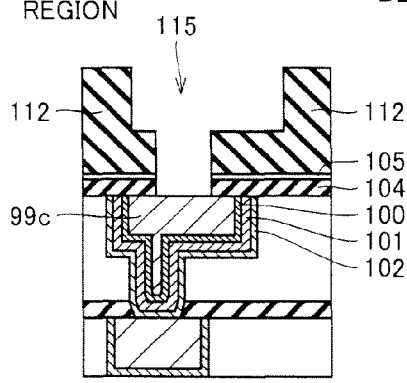
(D) BL PERIPHERAL REGION ←→ BL DIRECTION FIG. 33
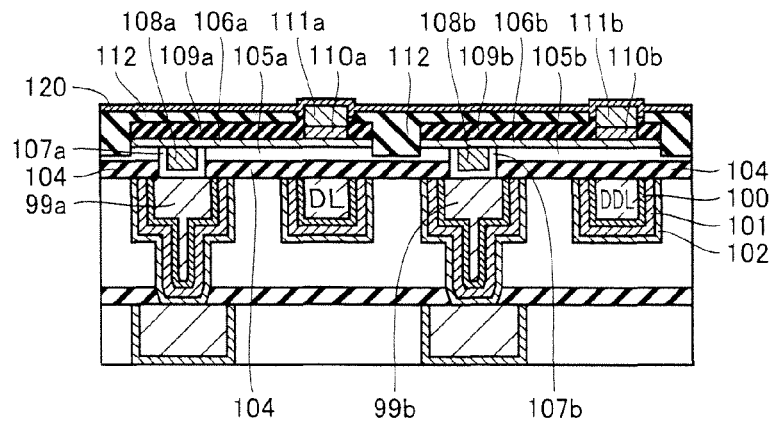
(A) ← BL DIRECTION →
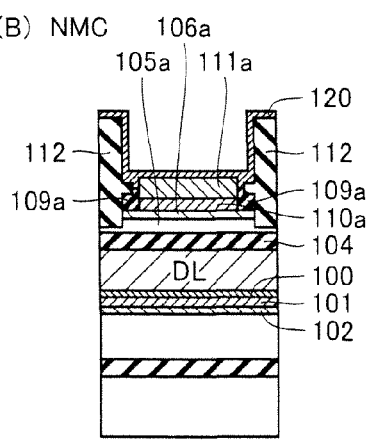
(B) NMC
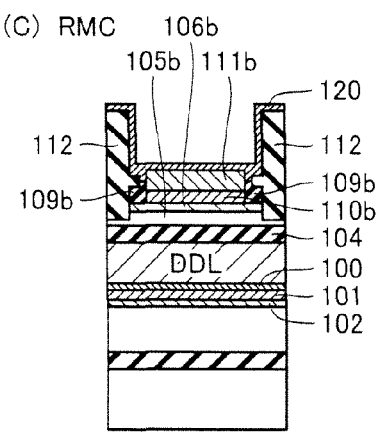
(C) RMC
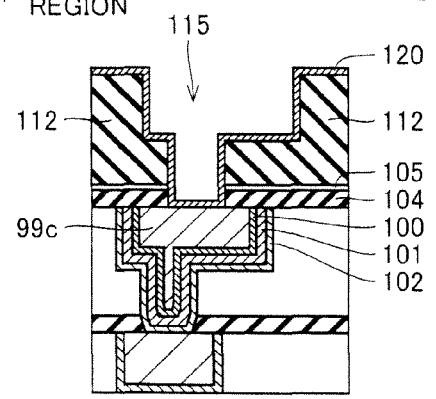
(D) BL PERIPHERAL REGION ← BL DIRECTION →

FIG.34
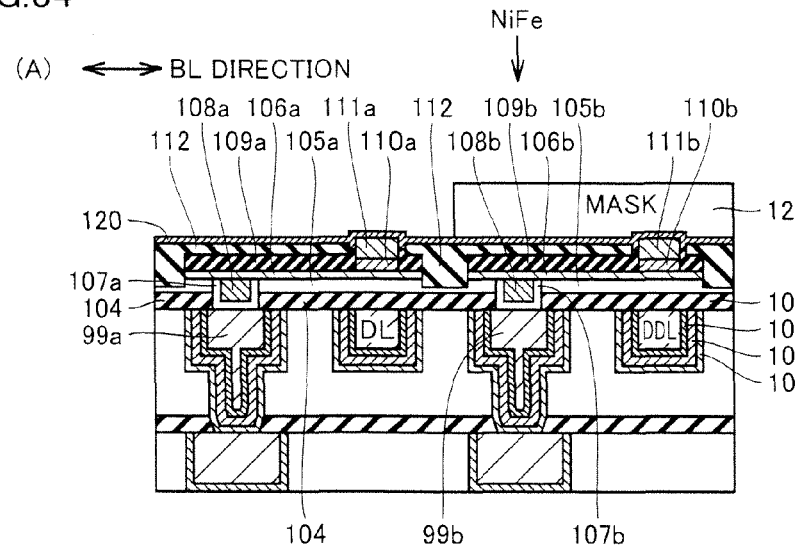
(A) ← BL DIRECTION →
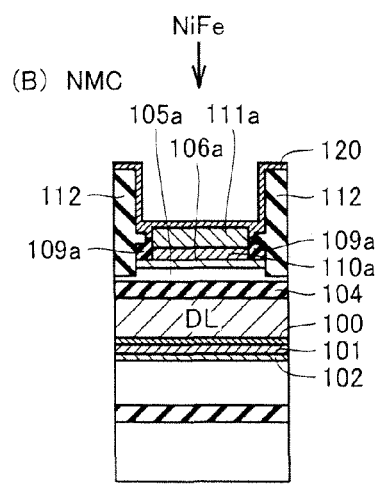
(B) NMC
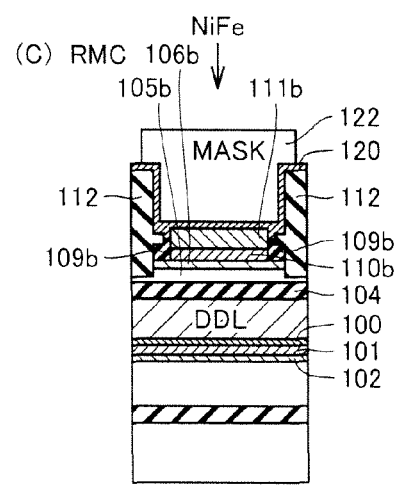
(C) RMC
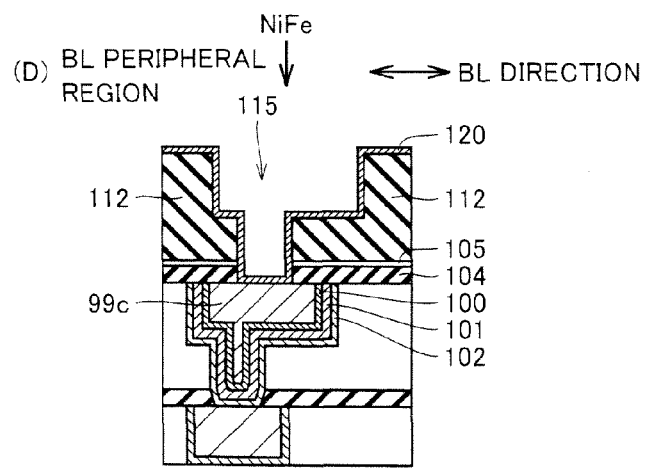
(D) BL PERIPHERAL REGION FIG.36
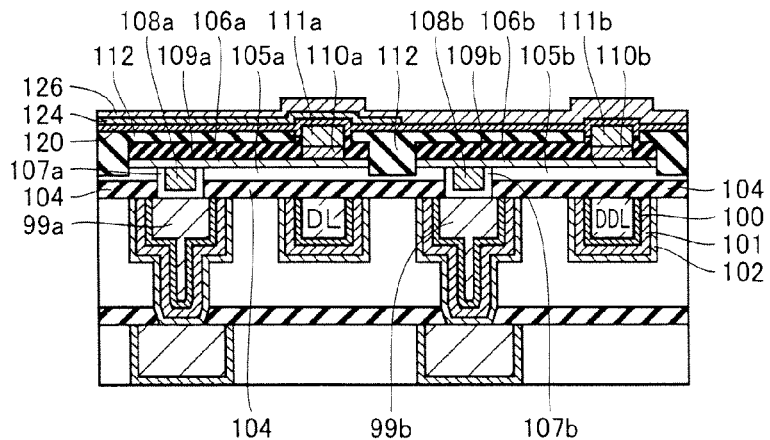
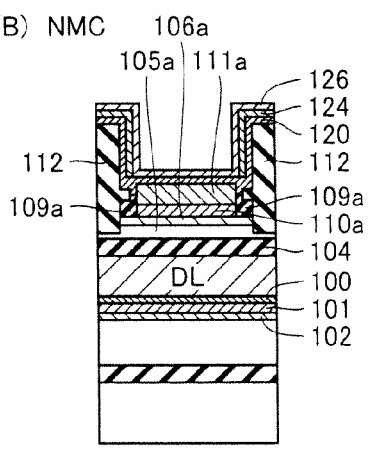
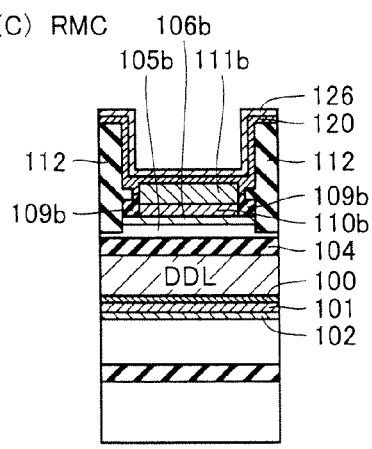
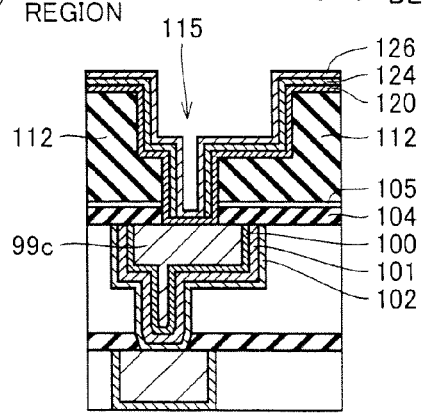

FIG.37
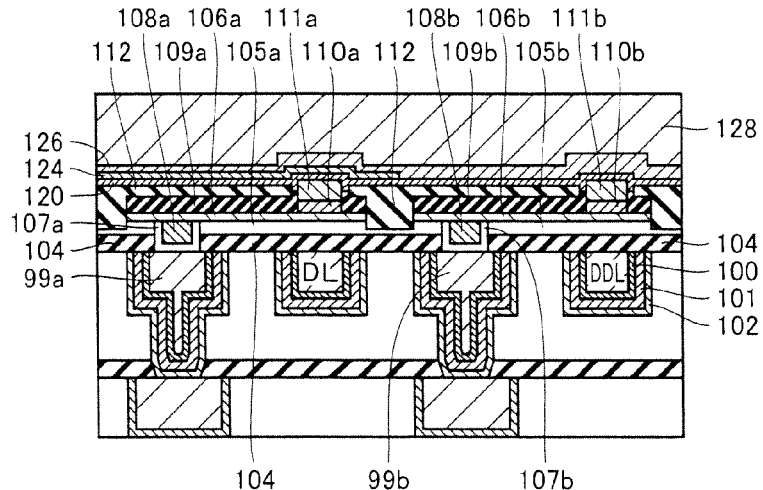
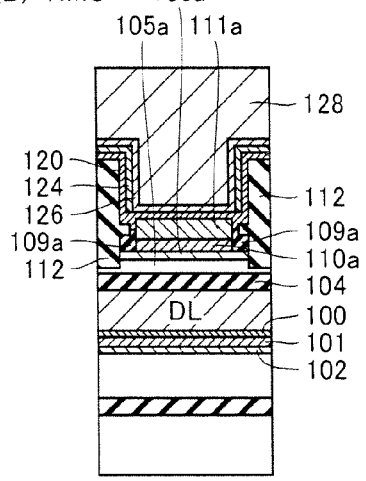
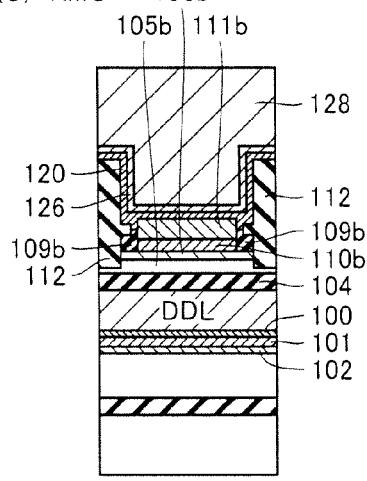
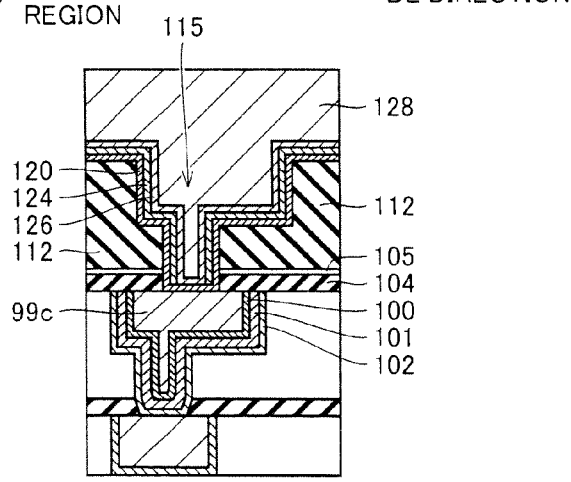

FIG.38
(A) ←→ BL DIRECTION
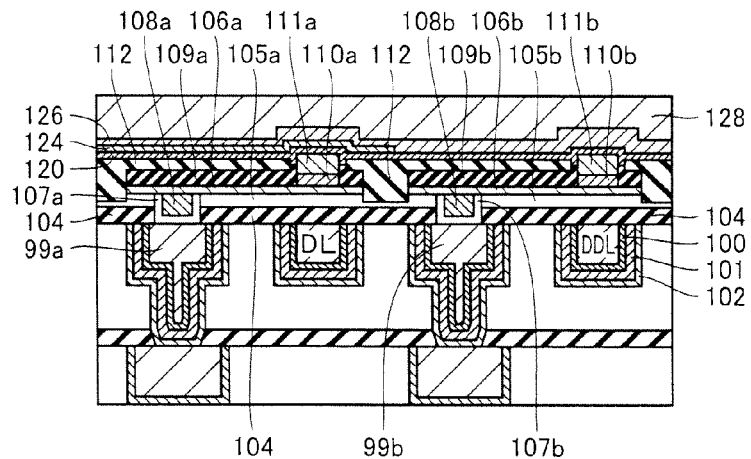
(B) NMC
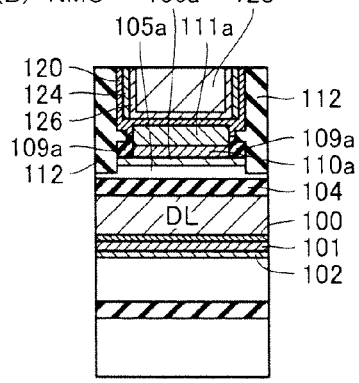
(C) RMC
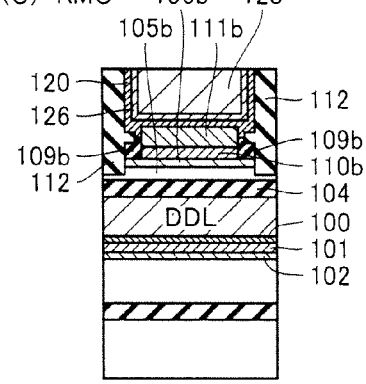
(D) BL PERIPHERAL REGION ←→ BL DIRECTION
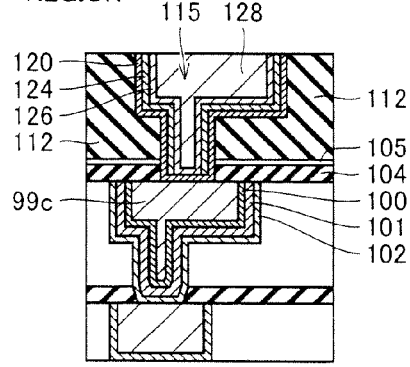

FIG.39
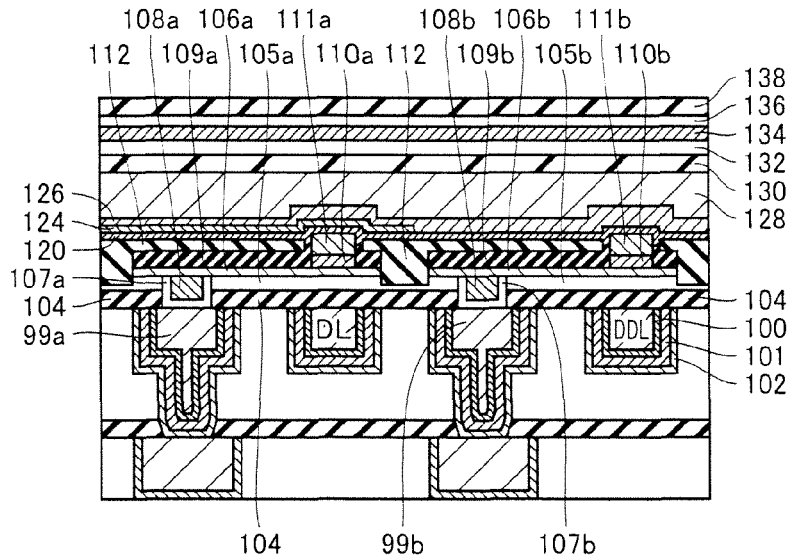
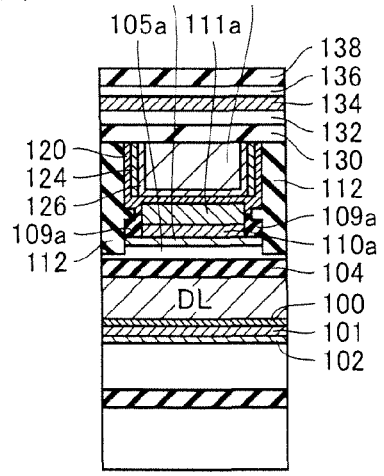
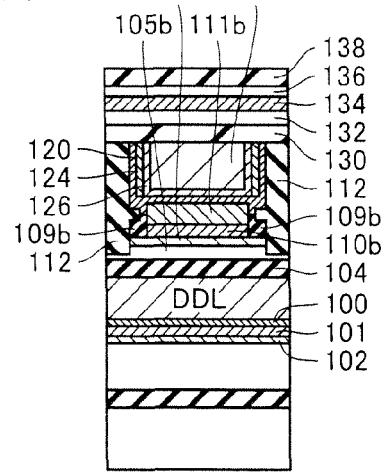
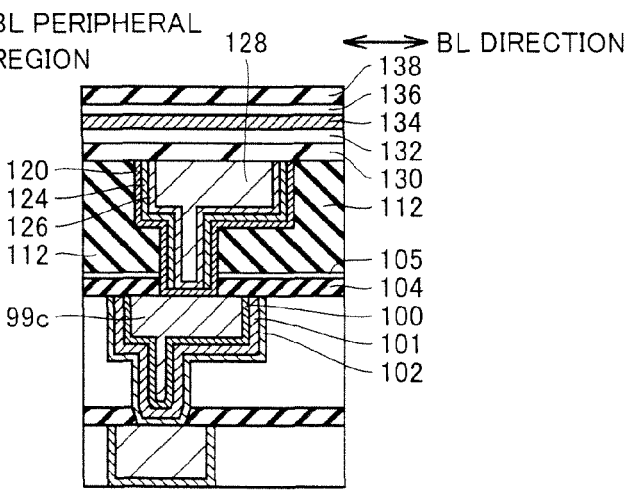

FIG.40
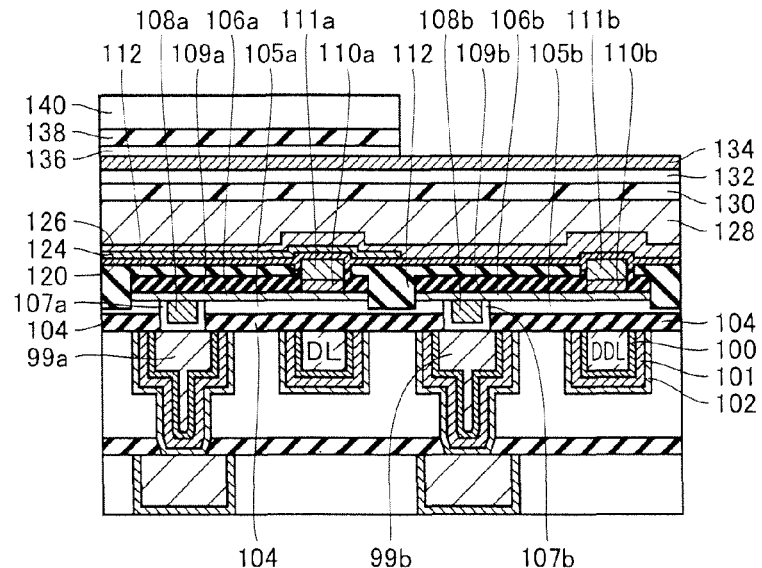
(A) ← BL DIRECTION →
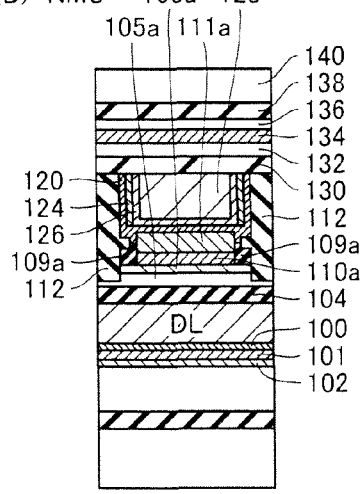
(B) NMC
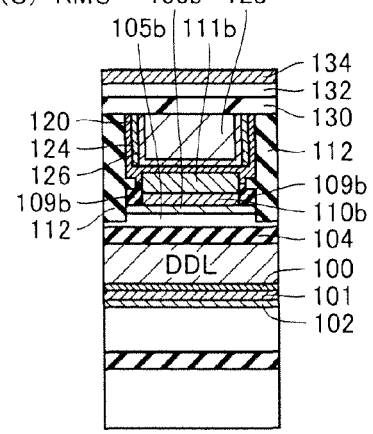
(C) RMC
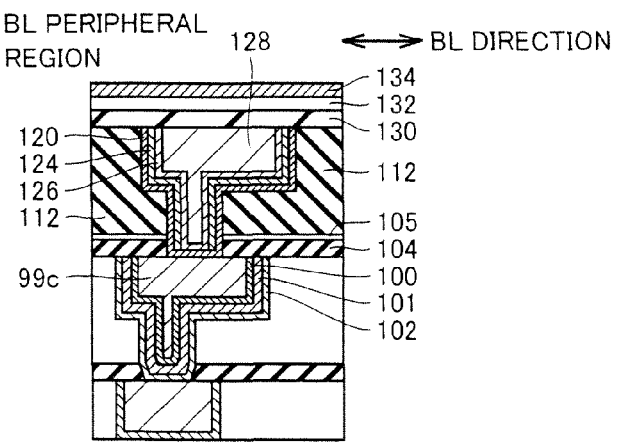
(D) BL PERIPHERAL REGION ← BL DIRECTION →

FIG.41
(A) ←→ BL DIRECTION
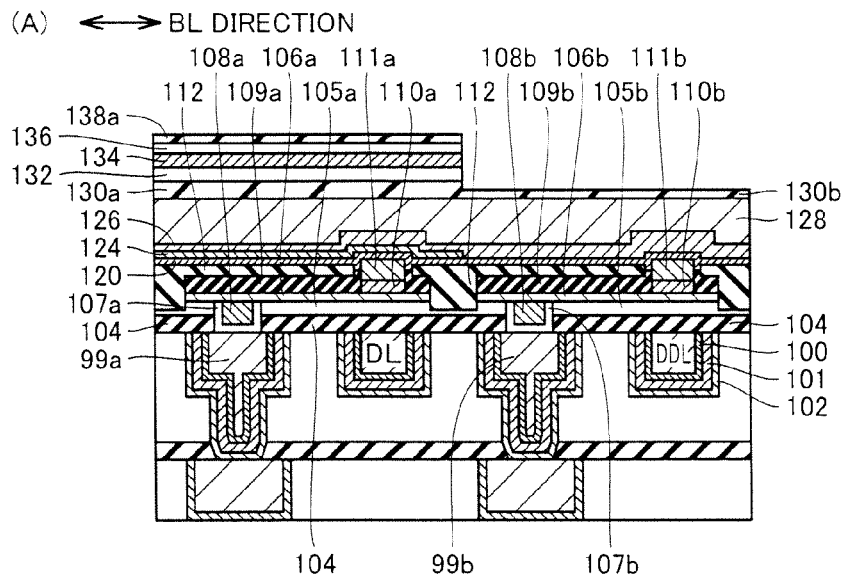
(B) NMC
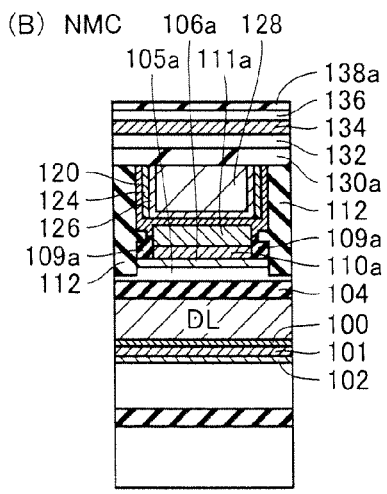
(C) RMC
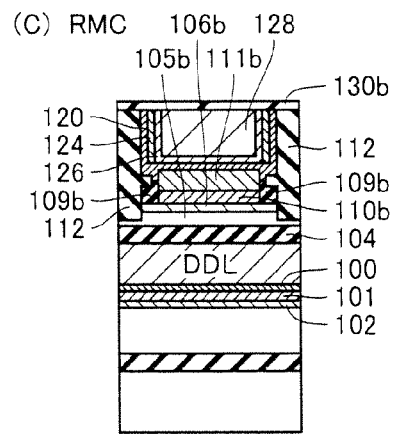
(D) BL PERIPHERAL REGION ←→ BL DIRECTION
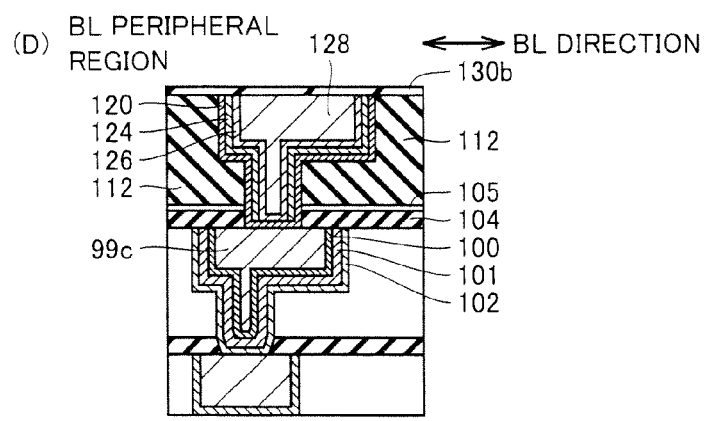

SEMICONDUCTOR DEVICE

RELATED APPLICATIONS

This application is the U.S. National Phase under 35 U.S.C. §37! of International Application No. PCT/JP2009/059648, filed on May 27, 2009, the disclosure of which is incorporated by reference herein.

TECHNICAL FIELD

The present invention relates generally to semiconductor devices and particularly to semiconductor devices having a magnetic semiconductor memory function to store information in accordance with a resistance value of a magnetoresistive element. More specifically, the present invention relates to a configuration for improving precision in data read in the magnetic semiconductor memory.

BACKGROUND ART

A magnetic random access memory (MRAM) is a storage device utilizing a tunnel magneto-resistance (TMR) element or a magnetic tunnel junction (MTJ) element having a tunnel magneto-resistance (TMR) effect as a memory cell (a magnetic memory cell). An MRAM cell (a magnetic memory cell) is configured of two ferromagnetic thin films and a tunnel insulation film between the two ferromagnetic thin films. When the magnetic thin films on and under the tunnel insulation film are parallel in magnetic moment, a magnetic resistance attains a minimum value, whereas when the magnetic thin films are antiparallel in magnetic moment, a magnetic resistance attains a maximum value. This magnetoresistance effect is utilized to correlate large and small magnetic resistance values with logical values of "0" and "1". In a data reading, a current is passed through a magnetic memory cell and information stored therein is read depending on the magnitude of an amount of the current.

The information stored in an MRAM cell holds a state of a magnetic moment until a magnetic field exceeding a threshold value level is applied in an opposite direction to change the direction of the magnetic moment. The stored information can thus be stored in a non-volatile manner substantially permanently.

Writing of storage information into an MRAM cell (a magnetic memory cell) is performed as follows: Write currents are passed through digit and bit lines orthogonal to each other. A combined magnetic field of the magnetic fields induced by the write currents changes a direction of a magnetic moment of a variable magnetoresistive element (a TMR element or an MTJ element) of the MRAM cell. The variable magnetoresistive element of the MRAM cell has two ferromagnetic films, one of which is utilized as a free layer and the other of which is utilized as a fixed layer. The fixed layer has its magnetic moment fixed in direction, whereas the free layer has its magnetic moment set in direction according to the storage information. A magnetic field of a sufficient magnitude to set the direction of the magnetic moment of the free layer is induced by the write currents on bit and digit lines to write data.

As high integration of MRAM advances, a cell is reduced in occupation area and bit and digit lines are also reduced in width. Accordingly, the bit and digit lines can pass smaller currents, resulting in a reduced intensity of an induced magnetic field. To compensate for such reduction in writing magnetic field due to miniaturization of cells, a clad interconnect structure is applied to bit and digit lines. Examples of the clad interconnect structure are described in patent literatures 1 and 2 (Japanese Patent Laying-open Nos. 2006-32762 and 2009-38221, respectively). In patent literatures 1 and 2, a high permeability film is provided to surround bit and digit lines in three directions, and a magnetic field is applied to a variable magnetoresistive element from the lines at their respective surfaces that are not surrounded by the high permeability film. The high permeability film is thus utilized as a magnetic shield film to confine a magnetic field for generating the magnetic field concentrately to induce a large magnetic field by the use of small write currents to set a direction of magnetization (or of a magnetic moment) of the variable magnetoresistive element.

CITATION LIST

Patent Literatures

PTL 1: Japanese Patent Laying-open No. 2006-32762
PTL 2: Japanese Patent Laying-open No. 2009-38221

SUMMARY OF INVENTION

Technical Problem

MRAM cells are disposed in rows and columns within a memory cell array. Normally, a bit line is arranged corresponding to an MRAM cell column and a digit line is arranged corresponding to an MRAM cell row. In data write, write currents flow through a bit line corresponding to a selected column and a digit line corresponding to a selected row. In that case, for an MRAM cell in a half-selected state, i.e., an MRAM cell on a selected row and a non-selected column or on a non-selected row and a selected column, only a magnetic field induced by a current flowing through the bit or digit line, or a uniaxial current-induced magnetic field, is applied. The MRAM cell in the half-selected state experiences data write disturbance by the applied magnetic field, and the data stored therein may erroneously be inverted. The possibility of such erroneous inversion (erroneous inversion probability) increases in proportion to the magnitude of the disturbing magnetic field received. As the erroneous inversion probability of a bit (or MRAM cell) increases failure rate in use as a storage device increases, causing a problem in reliability.

In MRAM, in a data read, a reference cell is used to generate a reference current for determining whether a selected MRAM cell stores data of "1" or "0". The reference cell is subjected in product shipment to writing of fixed data thereto and thereafter the reference cell is not subjected to any writing of data. The reference cell is disposed in the same array with normal MRAM cells used to store data, and an MRAM cell identical in structure to the normal MRAM cell is utilized for the reference cell. If write disturbance causes inversion of data stored in the reference cell, there is no means for determining that the reference cell's storage data has been inverted and for recovering the inverted data (i.e., there is no additional reference cell provided for reading the data stored in the reference cell having its storage data inverted).

If the reference cell having its stored data inverted due to write disturbance is used, reading data from any normal MRAM cells will fail. As such, the reference cell is required to be more reliable than the normal MRAM cell.

In a data writing, a disturbing magnetic field is applied to a reference cell whenever a write operation is performed. When the clad interconnect structure is applied to bit and digit lines, a magnetic field concentration is caused and accordingly, a relatively large disturbing magnetic field is applied, resulting in a reduced write disturbance margin. Furthermore, even if the disturbing magnetic field is weak, it is applied repeatedly, and as time elapses, the possibility that the data stored in the reference cell is inverted increases.

Patent Literatures 1 and 2 describe that in order to connect a bit line in a clad interconnect structure to a peripheral circuit, the bit line, in the peripheral circuit portion, is formed into an unclad interconnect structure. Furthermore, to simplify patterning of a magnetic shield film, an insulation film is provided between the magnetic shield film and a barrier film to prevent electrical short circuit between the magnetic shield film and a bit or digit line conductor. Patent Literatures 1 and 2, however, only indicate a configuration for facilitating the patterning of a clad interconnect structure. These documents do not provide any consideration on the influence of a disturbing magnetic field on a reference cell in data writing.

An object of the present invention is to provide a semiconductor device that can stably hold data stored in a reference cell.

Another object of the present invention is to provide a semiconductor device having a reference cell with an improved write disturbance margin.

Solution to Problem

The present semiconductor device according to the present invention includes in one embodiment: a memory cell array having normal magnetic memory cells and reference cells arranged in an aligned manner, and a first writing magnetic field supply line applying a writing magnetic field to the normal magnetic memory and reference cells. In the memory cell array the normal magnetic memory cells are disposed in rows and columns and the reference cells are aligned in the direction of one of the row and column of normal magnetic memory cells and generates a reference current in reading data from a normal magnetic memory cell. The first writing magnetic field supply line has, for the normal magnetic memory cells, a clad interconnect structure configured of a conductor passing a write current therethrough and a high permeability film magnetically shielding the conductor and has a partially clad or unclad interconnect structure for the reference cells. The "clad interconnect structure" refers to a structure covering the conductor with the high permeability film except a surface of the conductor opposite to the normal magnetic memory cell or the reference cell, and the "partially clad or unclad interconnect structure" refers to a structure having at least one conductor surface in addition to the surface of the conductor opposite to the cell uncovered or non-covered with the high permeability film.

In another embodiment, the semiconductor device according to the present invention includes: a plurality of magnetic memory cells disposed in rows and columns and including magnetoresistive elements, respectively, each magnetoresistive element having a layered structure including a free layer having a direction of magnetization set in accordance with data stored in the cell and a fixed layer having a direction of magnetization fixed regardless of data stored in the cell; a plurality of first write current lines each arranged corresponding to one of the row and the column of the memory cells and applying a current induced magnetic field to the corresponding magnetic memory cells in data writing; and a plurality of second write current lines each arranged corresponding to the other of the row and the column and applying a current induced magnetic field to the corresponding magnetic memory cells in the data writing.

The plurality of first write current lines and the plurality of second write current lines, at their respective crossings, sandwich corresponding magnetoresistive elements vertically, and the plurality of magnetic memory cells include a normal magnetic memory cell and a reference magnetic memory cell for generating a reference value for determining data in reading data from the normal magnetic memory cell. The crossings include a first crossing sandwiching the magnetoresistive element of the reference magnetic memory cell and a second crossing sandwiching the magnetoresistive element of the normal magnetic memory cell, and the first crossing has a conductor of corresponding one of the first and second write current lines covered with the magnetic shield film over a smaller number of surface(s) than the second crossing has.

Advantageous Effects of Invention

For a reference cell, a magnetic shield effect on a write current supply line is reduced. Thus in a data writing, a disturbing magnetic field intensity for the reference cell is reduced and the write disturbance margin increases for the reference cell.

BRIEF DESCRIPTION OF DRAWINGS

FIG. 25 schematically shows an arrangement of an interconnect structure of a digit line according to a fourth embodiment of the present invention.

FIGS. 26(A) to 26(C) show in cross section a step of fabricating a digit line according to the fourth embodiment of the present invention.

FIGS. 27(A) to 27(C) show in cross section a step subsequent to the step of FIG. 26.

FIGS. 29(A) to 29(C) schematically show in cross section a step subsequent to the step shown in FIG. 28.

FIGS. 30(A) to 30(C) schematically show structures in cross section of a digit line in a step subsequent to the step shown in FIG. 29.

FIGS. 31(A) to 31(C) schematically show structures in cross section of the digit line in a step subsequent to the step shown in FIG. 30.

FIGS. 32(A) to 32(D) schematically show structures in cross section of portions associated with a bit line in a step of fabricating the bit line in the fourth embodiment of the present invention.

FIGS. 33(A) to 33(D) schematically show structures in cross section of the portions associated with the bit line in a step subsequent to the step shown in FIG. 32.

FIGS. 34(A) to 34(D) schematically show structures in cross section of the portions associated with the bit line in a step subsequent to the step shown in FIG. 33.

FIGS. 36(A) to 36(D) schematically show structures in cross section of the portions associated with the bit line in a step subsequent to the step shown in FIG. 35.

FIGS. 37(A) to 37(D) schematically show structures in cross section of the portions associated with the bit line in a step subsequent to the step shown in FIG. 36.

FIGS. 38(A) to 38(D) schematically show structures in cross section of the portions associated with the bit line in a step subsequent to the step shown in FIG. 37.

FIGS. 39(A) to 39(D) schematically show structures in cross section of a portions associated with the bit line in another example of a step of fabricating the bit line in the fourth embodiment of the present invention.

FIGS. 40(A) to 40(D) schematically show structures in cross section of the portions associated with the bit line in a step subsequent to the step shown in FIG. 39.

FIGS. 41(A) to 41(D) schematically show structures in cross section of the portions associated with the bit line in a step subsequent to the step shown in FIG. 40.

DESCRIPTION OF EMBODIMENTS

First Embodiment

Figure 1:
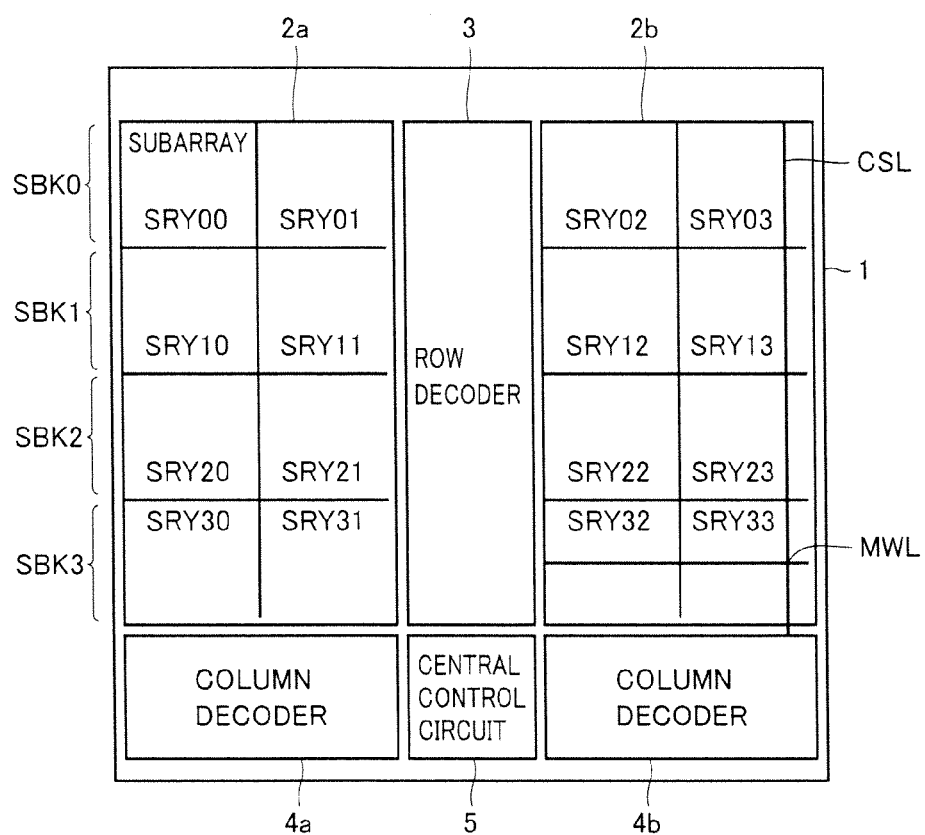
FIG. 1 schematically, generally shows an overall configuration of an MRAM according to the present invention.

FIG. 1 schematically shows an overall configuration of an MRAM (a semiconductor device) to which the present invention is applied. In FIG. 1, an MRAM 1 includes memory mats 2a and 2b, and a row decoder 3 disposed between memory mats 2a and 2b. Memory mats 2a and 2b are divided into a plurality of subblocks SBK0-SBK3. Subblocks SBK0-SBK3 each include four subarrays SRYs. Specifically, a subblock SBKi includes four subarrays SRYi0-SRYi3, wherein i=0 to 3.

Row decoder 3 has a hierarchical decoder configuration and drives to a selected state a main word line MWL shared by the corresponding subarrays in each subblock. For each subarray, a word line driver and a digit line driver are provided, as will be described later, to operate in response to a signal on main word line MWL, a subarray select signal and a write/read instruction signal to drive a word line or a digit line in a selected subarray to the selected state. In data reading, a word line is selected, and in data writing, a digit line is selected.

Column decoders 4a and 4b are provided for memory mats 2a and 2b, respectively. Column decoders 4a and 4b drive to the selected state a column select line CSL shared by subarrays aligned in a column direction (or a direction in which the column select line extends). In other words, column decoders 4a and 4b also have a hierarchical decoder configuration and operate in response to a signal on column select line CSL to control writing/reading data to/from a subarray in a selected subblock.

Between column decoders 4a and 4b a central control circuit 5 is disposed to operate in response to an operation instruction signal and an address signal (not shown) to control writing/reading data to/from MRAM 1.

MRAM 1 may be a memory macro disposed on the same semiconductor chip as a processor such as another logic or the like, or may be a lone memory chip. Accordingly, the term "semiconductor device" refers to both a lone MRAM chip and an integrated circuit device such as a system LSI including an MRAM macro.

Figure 2:
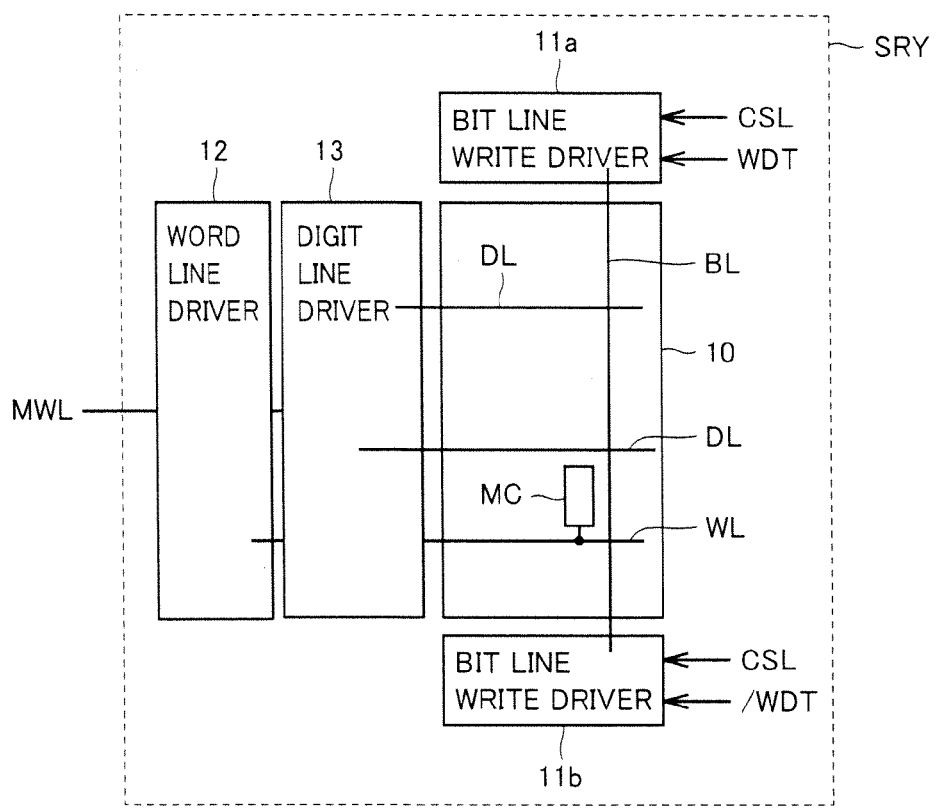
FIG. 2 schematically shows a configuration of a subarray shown in FIG. 1.

FIG. 2 schematically shows a configuration of subarrays SRY00-SRY03 to SRY30-SRY33 shown in FIG. 1. In FIG. 2, subarrays SRY00-SRY03 to SRY30-SRY33 are identical in configuration, and accordingly, a single subarray is denoted by a reference character SRY representatively.

In FIG. 2, subarray SRY includes a memory cell array 10 having a plurality of memory cells MCs disposed in rows and columns. Memory cell array 10 has a normal cell to store data therein and a reference cell to supply a reference current disposed together therein, as an example of its configuration will more specifically be described later.

In memory cell array 10, a bit line BL is provided corresponding to a memory cell column, and a word line WL is provided corresponding to a memory cell row, and furthermore, a digit line DL is provided corresponding to a memory cell row.

At the opposite ends of bit line BL, bit line write drivers 11a and 11b are disposed opposite to each other. In a data write, bit line write drivers 11a and 11b operate in response to a column select line on column select line CSL and write data WDT and /WDT to pass a write current through bit line BL of a selected column in a direction according to the write data.

If for bit line BL, write and read bit lines are separately provided, (write) bit line BL is separated from memory cell MC and only coupled to memory cell MC electromagnetically. If bit line BL is commonly used in both a write mode and a read mode, bit line BL is coupled with memory cell MC electromagnetically and electrically.

Digit line DL normally passes a current in a predetermined direction to generate a write assisting magnetic field in a data write. Word line WL is driven to the selected state in a data read when it corresponds to a selected row, and word line WL forms a path for passing a current between a corresponding bit line (a read bit line) and a source line (not shown) via memory cell MC.

A word line driver 12 and a digit line driver 13 are provided corresponding to word line WL and digit line DL, respectively. Word line driver 12 and digit line driver 13 receive a row select signal on main word line MWL, are selectively enabled in response to a write mode instruction signal (not shown), and drive to the selected state a word line or a digit line corresponding to main word line MWL.

For read related circuitry, sense amplifier circuits are disposed corresponding to the subarrays, respectively, and a read current is supplied to a bit line of a selected column to detect the amount of a current flowing through the bit line, although not shown in FIG. 2. As will be described later, in this read, a reference cell supplies a reference current and a current flowing through a selected normal cell is compared with that flowing through the reference cell to read data.

Figure 3:
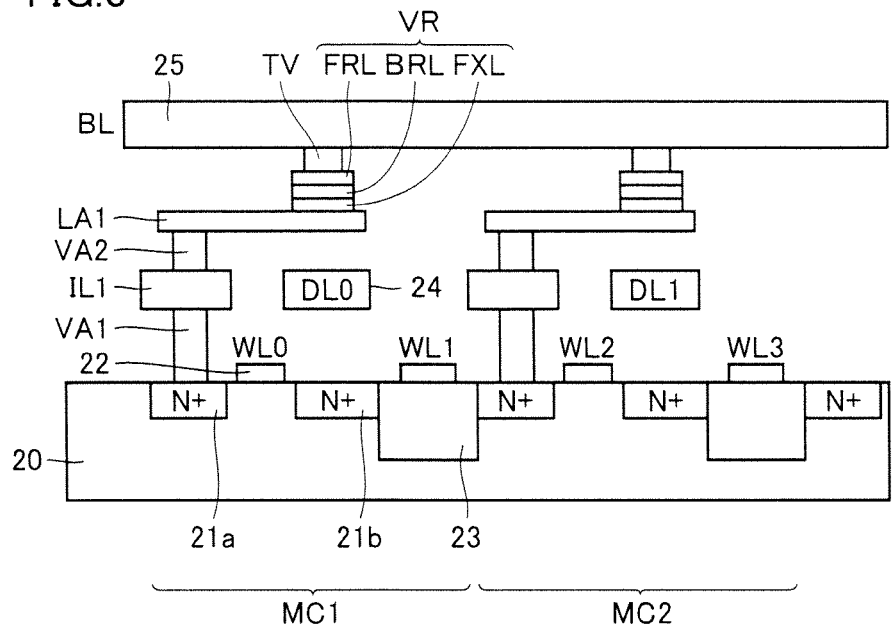
FIG. 3 schematically shows a cross sectional structure of a memory cell shown in FIG. 2.

FIG. 3 schematically shows a cross sectional structure of memory cell MC. FIG. 3 schematically shows a cross sectional structure of two memory cells MC1 and MC2 aligned in the column direction. Furthermore in FIG. 3, memory cells MC1 and MC2 are identical in structure and accordingly, for simplicity, only memory cell MC1 has its components denoted by reference characters.

Memory cell MC1 includes n-type impurity regions 21a and 21b provided on a surface of a p-type semiconductor substrate region 20 and spaced from each other, and a gate electrode interconnect 22 provided on the substrate region between impurity regions 21a and 21b with a gate insulation film (not shown) interposed.

Impurity region 21b constructs a source line (SL) and gate electrode interconnect 22 constructs a portion of a word line WL0. Between an impurity region of memory cell MC1 and an impurity region of memory cell MC2 there is an element isolation region 23 formed for example of shallow trench isolation (STI) film. A gate electrode interconnect configuring a word line WL1 is disposed on element isolation region 23.

Impurity region 21a is electrically connected to a local interconnect LA1 through a first via VA1, an intermediate interconnect IL1 and a second via VA2. A variable magnetoresistive element VR is disposed at local interconnect LA1. Variable magnetoresistive element VR is a TMR device or an MTJ device and has a structure formed of a free layer FRL, a barrier layer BRL and a fixed layer FXL stacked on one another. Variable magnetoresistive element VR has a top electrode (not shown) electrically connected to a conductive line 25 through a via TV. Conductive line 25 constructs a bit line BL. A conductive line 24 forming a digit line DL0 is disposed in the same interconnection layer as intermediate interconnect IL. Conductive line 24 and variable magnetoresistive element VR are aligned when seen in a top view.

For memory cell MC2, a word line WL2 and a digit line DL1 are disposed correspondingly. A word line WL3 is disposed on an element isolation region between memory cell MC2 and a memory cell (not shown). In the column direction a memory cell is connected to every other word line because the memory cell is disposed in a so called "folded bit line" configuration, as will be described later in more detail.

In a data write, a current is passed through conductive line 25 constructing bit line BL and conductive line 24 forming digit line DL0. The current flowing through bit line BL and that flowing through digit line DL0 induce magnetic fields, which provide a combined magnetic field, which sets a direction of a magnetic moment of free layer FRL of variable magnetoresistive element VR.

In this data write, while bit line BL passes a write current therethrough, digit line DL1 is in a non-selected state and does not induce a magnetic field. Accordingly, at memory cell MC2, a bit line write current induced magnetic field is only applied and a magnetic field equal to or smaller than a threshold value in intensity is only applied, and a sufficient write disturbance margin is ensured and the free layer of the variable magnetoresistive element has its magnetic moment unchanged in direction.

For a normal cell conductive line 24 constructing digit line DL and conductive line 25 constructing bit line BL have a clad interconnect structure in which three surfaces are surrounded by magnetic shield film when seen in cross section.

Figure 4:
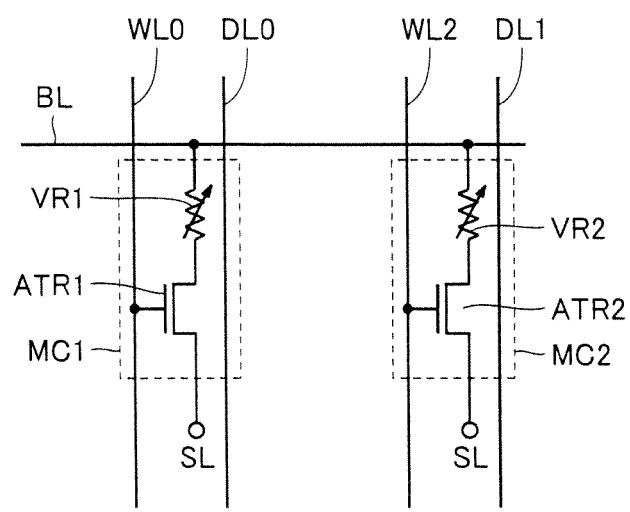
FIG. 4 shows an electrically equivalent circuit of a memory cell shown in FIG. 3.

FIG. 4 shows an electrically equivalent circuit of memory cells MC1 and MC2 shown in FIG. 3. In FIG. 4, memory cell MC1 includes a variable magnetoresistive element VR1 and an access transistor ATR1 that are connected in series between bit line BL and source line SL. Access transistor ATR1 has a gate connected to word line WL0 and digit line DL0 is arranged corresponding to variable magnetoresistive element VR1. Memory cell MC2 includes a variable magnetoresistive element VR2 and an access transistor ATR2 that are connected in series between bit line BL and source line SL. Access transistor ATR2 has a gate connected to word line WL2 and digit line DL1 is arranged corresponding to variable magnetoresistive element VR2.

In the configuration for memory cells MC1 and MC2 shown in FIG. 4, bit line BL is utilized in a data write and read operation mode. Memory cells are aligned along the bit line for every other row in order to implement the folded bit line structure, as has been set forth previously, or as will be described hereinafter.

Figure 5:
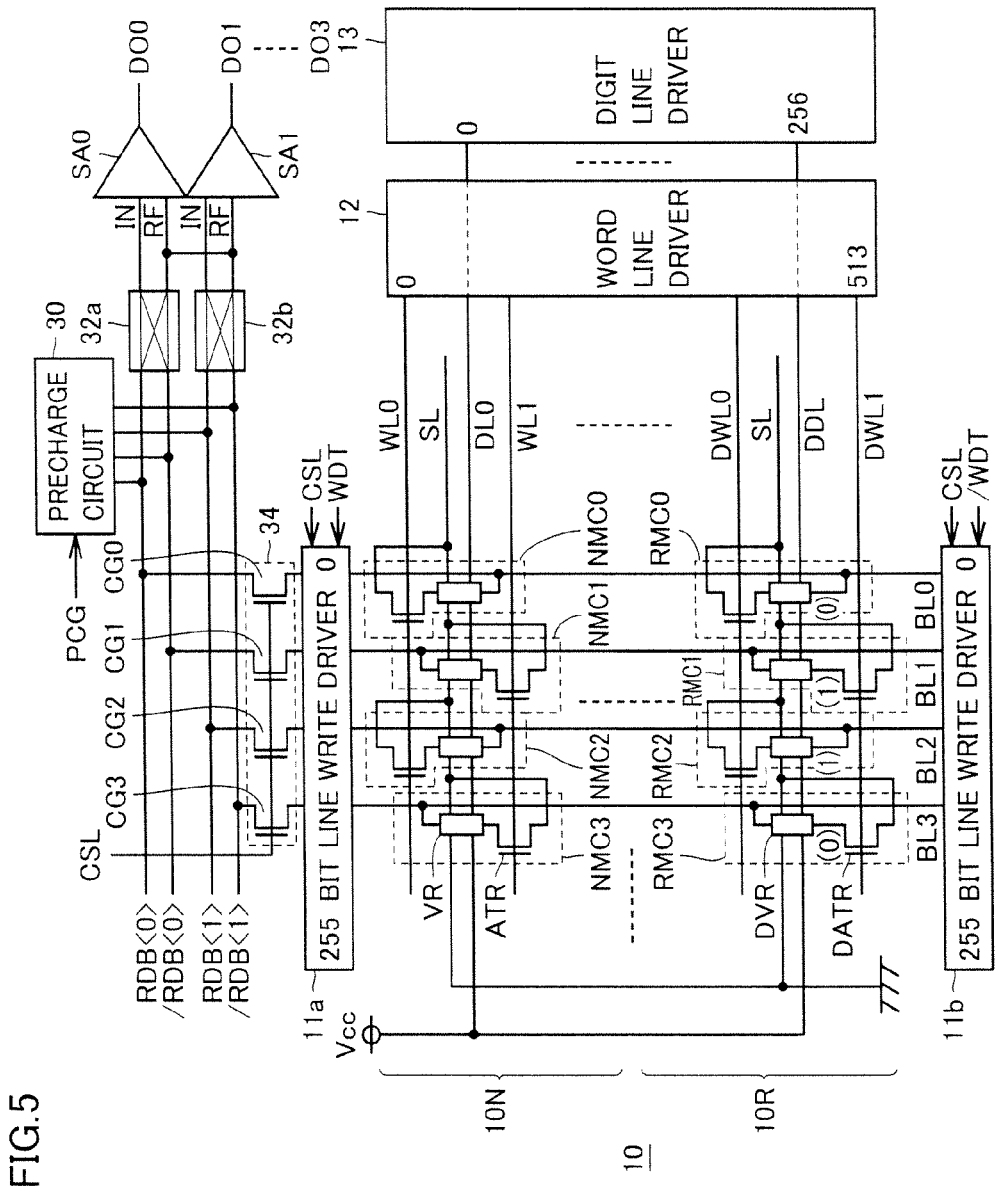
FIG. 5 shows one example of a specific configuration of the FIG. 2 subarray.

FIG. 5 shows the configuration of the subarray shown in FIG. 2 in more detail. In FIG. 5, memory cell array 10 includes a normal cell region 10N having normal (memory) cells disposed to store data, and a reference cell region 10R having reference cells disposed to generate a reading reference current. Normal cell region 10N has normal cells NMCs aligned in rows and columns and reference cell region 10R has reference cells RMCs disposed corresponding to the normal cell columns, respectively.

In the first embodiment, as one example, 4-bit data is written and read in a single subarray. FIG. 5, however, representatively shows for simplicity a configuration of a portion in which 2-bit data is written and read. Specifically, normal cell region 10N has normal cells NMC0-NMC3 disposed therein, and reference cells RMC0-RMC3 are aligned with normal cells NMC0-NMC3, respectively, in the column direction. Normal cells NMC0-NMC3 have variable magnetoresistive elements (TMR or MTJ elements) VRs aligned in the row direction, and access transistors ATRs aligned on every other column. Accordingly, digit line DL0 is disposed corresponding to variable magnetoresistive elements VRs of normal cells NMC0-NMC3, and word line WL0 is connected to the gate electrodes of access transistors ATRs of normal cells NMC0 and NMC2. Word line WL1 is coupled with the gates of access transistors ATRs of normal cells NMC1 and NMC3. Normal cells NMC0-NMC3 have their variable magnetoresistive elements VRs electrically and magnetically coupled with bit lines BL0-BL3, respectively.

Reference cell region 10R also has reference cells RMC0-RMC3 with dummy magnetoresistive elements DVRs aligned in the row direction. Furthermore, the reference cells have access transistors (or dummy access transistors) disposed in the row direction in a zigzag fashion and aligned in the row direction for every other column. In other words, reference cells RMC0 and RMC2 have dummy access transistors DATRs coupled with a dummy word line DWL0 and reference cells RMC1 and RMC3 have dummy access transistors DATRs coupled with a dummy word line DWL1.

Reference cells RMC0 and RMC3 store data of "0" and their dummy variable magnetoresistive elements DVRs are set in a high resistance state. Reference cells RMC1 and RMC2 store data of "1" and their dummy variable magnetoresistive elements DVRs are set in a low resistance state. Reference cells NMC0-NMC3 and reference cells RMC0-RMC3 have their source lines SLs connected commonly to a ground node.

Word line driver 12 drives word line WL and dummy word line DWL to the selected state in response to a signal on a main word line (not shown) and an operation mode instruction. In FIG. 5, 512 normal word lines WL0, . . . WL511 (not shown) are provided and dummy word lines DWL0 and DWL1 are provided by way of example.

Digit line driver 13 drives digit line DL to the selected state in response to a signal on a main word line (not shown) and an operation mode instruction, and in addition drives a dummy digit line DDL to the selected state in writing to a reference cell. In this configuration, a configuration is shown by way of example in which variable magnetoresistive element VR is correspondence with a normal word line, normal cells have variable magnetoresistive elements aligned in the row direction, the number of digit lines is ½ times that of word lines, normal digit lines DL0-DL255 are provided, and dummy digit line DDL is provided.

Bit line write drivers 11a and 11b are provided for bit lines BL0-BL3 . . . at their opposite ends, opposite to each other. FIG. 5 shows 256 bit lines, i.e., bit lines BL0-BL255, by way of example. Bit line write driver 11a operates in response to a column select signal on column select line CSL and write data WDT to pass a current on bit lines of 2 bits of selected columns in a direction according to the write data. Bit line write driver 11b operates in response to a column select signal on column select line CSL and complementary write data /WDT to drive a current on a selected bit line of 2 bits in a direction according to the write data.

Bit line write drivers 11a and 11b operate in opposite directions in a data write, i.e., when one performs charging, the other performs discharging. As has been described previously, 4-bit data is written and read in a subarray, and accordingly, a unit group of 4 bit lines as shown in FIG. 5 is separately provided further.

A read column select circuit 34 is provided for a set of bit lines BL0-BL3. Read column select circuit 34 is provided with read column select gates CG0-CG3 corresponding to bit lines BL0-BL3, respectively, and they are driven to the selected state in response to a signal on a common column select line CSL in parallel. When read column select gates CG0 and CG1 conduct, they couple bit lines BL0 and BL1 with read data lines RDB<0> and /RDB<0>. When read column select gates CG2 and CG3 conduct, they couple bit lines BL2 and BL3 with read data lines RDB<1> and /RDB<1>.

A data line precharge circuit 30 is provided for read data lines RDB<0>, /RDB<0>, RDB<1> and /RDB<1>. Precharge circuit 30 operates in response to a precharge instruction signal PCG to precharge read data lines RDB<0>, /RDB<0>, RDB<1> and /RDB<1> to a predetermined voltage level. In data reading, the precharge voltage is supplied to a selected bit line to cause a voltage difference between the selected bit line and a source line to generate a state of passing a current.

A bus switch 32a is provided for read data lines RDB<0> and /RDB<0>, and a bus switch 32b is provided for read data lines RDB<0> and /RDB<1>. Bus switches 32a and 32b are coupled with sense amplifiers SA0 and SA1, respectively. Sense amplifiers SA0 and SA1 each have a data input IN and a reference input RF. In data reading, when a single word line WL is driven to the selected state, two normal cells are coupled with read data lines. The remaining read data lines are coupled with reference cells selected by a dummy word line. By bus switches 32a and 32b, bit lines with which normal cells are coupled are coupled with sense amplifiers SA0 and SA1 at data inputs INs and bit lines with which reference cells are coupled are coupled to reference inputs RFs.

Sense amplifiers SA0 and SA1 have their respective reference inputs RFs interconnected with each other. Thus, two sense amplifiers SA0 and SA1 have their respective reference inputs RFs coupled with a reference cell of the high resistance state (storing data of 0) and a reference cell of the low resistance state (storing data of 1). An average of currents Imin and Imax passing through the reference cells of the high and low resistance states, i.e., (Imin+Imax)/2, flows through the read data lines coupled with reference cells.

Sense amplifiers SA0 and SA1 are each a current sense amplifier for example and include a current source, and identify, with reference to the average current, the magnitude of a current output from the current source, flowing via a selected bit line and thus flowing through a selected cell (i.e., differentially amplify a difference between currents) to generate internal read data DO0 and DO1. This 2-bit read path is also provided for 2-bit data DO2 and DO3.

Specifically, in a data read, when word line WL0 is selected, dummy word line DWL1 is selected and currents according to data in normal cells NMC0 and NMC2 flow through bit lines BL0 and BL2, whereas currents according to data stored in reference cells RMC1 and RMC3 flow through bit lines BL1 and BL3. In contrast, when word line WL1 is selected, dummy word line DWL0 is selected and currents according to data stored in reference cells RMC0 and RMC2 flow through bit lines BL0 and BL2 and currents according to data stored in normal cells NMC1 and NMC3 flow through bit lines BL1 and BL3.

Bus switches 32a and 32b have their connection paths switched depending on whether an even-numbered word line (WL0) or an odd-numbered word line (WL1) is selected, and sense amplifiers SA0 and SA1 have their data inputs INs coupled, via associated read data buses, with normal cells and have their reference inputs RFs coupled, via associated read data buses, with reference cells RMC. Word line driver 12 also drives dummy word line DWL0 or dummy word line DWL1 depending on whether a row of an odd-numbered word line or a row of an even-numbered word line is selected.

In a data write, a single digit line (e.g., DL0) is driven to the selected state by digit line driver 13. In this case, for a set of normal cells NMC0-NMC3 column select line CSL is driven to the selected state in response to an applied column address signal, and a write current is supplied to two of four bit lines by bit line write drivers 11a and 11b.

The selection of a column select line in the data write and the data read is performed for example as follows: Specifically, in the data read, an external column address signal has its address bits other than the least significant bit decoded to drive a column select line to the selected state, and bus switches 32a and 32b have their connection paths set in accordance with the least significant column address bit. In the data write also, column select line CSL is driven to the selected state in accordance with address bits excluding the least significant bit of a column address signal and, of a set of four bit lines, two bit lines are designated in response to a signal on column select line CSL and the least significant column address bit, and a write current is supplied by bit line write drivers 11a and 11b to the two selected bit lines.

In a data write, a transfer path for write data WDT and /WDT may be set in accordance with whether a column address signal is an even or odd and a bit line write drive circuit in bit line write drivers 11a and 11b that has received effective write data may be configured to supply a bit line write current by a combination with a signal on a column select signal. Furthermore, bus switches 32a and 32b may have their connection paths set in accordance with a row address or depending on whether an even-numbered word line or an odd-numbered word line is selected.

Figure 6:
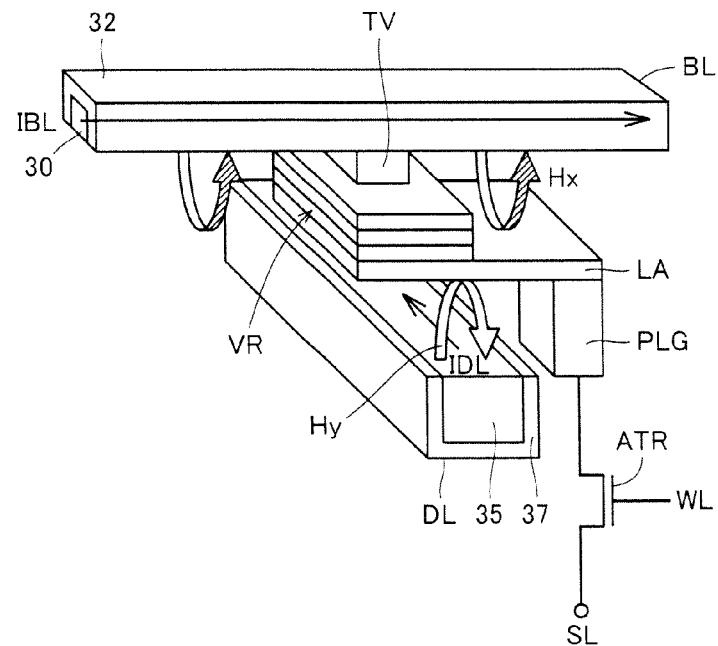
FIG. 6 schematically shows a structure of a memory cell, a bit line and a digit line shown in FIG. 5.

FIG. 6 schematically shows a clad interconnect structure of bit line BL and digit line DL. In FIG. 6, variable magnetoresistive element VR is connected to access transistor ATR via local interconnect LA and a plug PLG. Plug PLG corresponds to vias VA1 and VA2 and intermediate interconnect IL1 shown in FIG. 3.

Variable magnetoresistive element VR has a top electrode (not shown) connected through via TV to bit line BL. Bit line BL is formed of a conductor 30 passing a bit line current IBL therethrough and a magnetic shield film (a high permeability film) 32 covering the three surfaces of conductor 30 other than a surface facing variable magnetoresistive element VR. Permalloy film is known for the high permeability film, and 78 Ni—Fe film, 50 Ni—Fe film, 45 Ni—Fe film or other similar NiFe based permalloy film can be used and excellently anticorrosive 42 Ni—Cr—Fe permalloy film can be used. Furthermore, high permeability film (a soft magnetic film) such as high purity Fe film, Ni film, FeSi film, FcAlSi film, FeCoV film can be used. Permeability indicates a rate at which magnetization increases when a magnetic field is applied to a magnetic material, and indicates the magnetic material's absorbability of a magnetic line of force. High permeability film can absorb a magnetic line of force and can be utilized for a magnetic shield film. Soft magnetic film is a magnetic film of high permeability and low coercivity. The following description also discusses high permeability film of NiFe-based permalloy film. However, the high permeability film may be any of the aforementioned films.

Digit line DL is configured of a conductor 35 for passing a digit line current IDL therethrough, and a magnetic shield film (a high permeability film) 37 covering the three surfaces of digit line conductor 35 other than a side surface facing variable magnetoresistive element VR. Access transistor ATR has a gate connected to word line WL and source line SL is normally maintained at a ground voltage level.

As shown in FIG. 6, it is assumed that currents flow through bit line BL and digit line DL in directions indicated by arrows, respectively. Specifically, when bit line current IBL flows through conductor 30 of bit line BL rightward as seen in the figure, a magnetic field Hx is generated in a direction orthogonal to that of bit line current IBL clockwise with respect to the direction of bit line current IBL. Likewise, when digit line current IDL flows through digit line DL, a magnetic field Hy is generated in a plane orthogonal to digit line current IDL clockwise with respect to a direction in which digit line current IDL moves. Bit line conductor 30 and digit line conductor 35 are shielded in three directions by magnetic shield layers 32 and 37, respectively, and the magnetic fields are generated concentrately at the side surfaces facing variable magnetoresistive element VR and are not generated outwardly through magnetic shield layers 32 and 37. Thus, the magnetic field from the remaining three surfaces can be concentrated at the magnetically unshielded surface, and even if bit line current IBL and digit line current IDL are small, large magnetic fields Hx and Hy can intensively be applied to variable magnetoresistive element VR. Furthermore, the clad interconnect structure allows magnetic flux to be concentrated at a memory cell (or variable magnetoresistive element VR) and can thus reduce a magnetic field leaking to an adjacent memory cell and hence crosstalk in a data write.

In this data write there is a possibility that a magnetic field induced by a uniaxial current is applied to a memory cell of the half-selected state and the clad interconnect structure decreases a write disturbance margin. Hereinafter, the write disturbance margin will be described.

Figure 7:
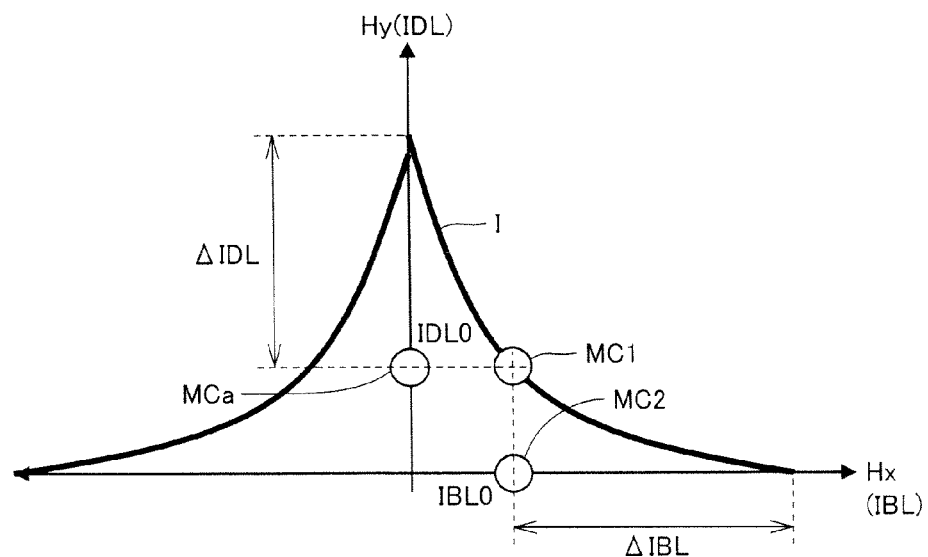
FIG. 7 shows a write characteristic curve and write margin of a memory cell.

FIG. 7 shows an asteroid curve representing write characteristics of a memory cell. In FIG. 7, the axis of ordinates represents magnetic field Hy and the axis of abscissas represents magnetic field Hx. Magnetic fields Hy and Hx are induced by digit line current IDL and bit line current IBL, respectively. When a combined magnetic field is present in an area outside the asteroid curve I, a free layer of memory cell has its magnetic moment inverted in direction. For selected memory cell MC1 (NMC, RMC), magnetic fields induced by bit line current IBL and digit line current IDL are combined together and applied, and the cell's magnetic moment is inverted in direction. On the other hand, to memory cell MC2 in the half-selected state on a selected column and a non-selected row, a magnetic field induced by bit line current IBL0 is applied, but no digit line current induced magnetic field is applied. Thus, a magnetic field applied to memory cell MC in the half-selected state falls within asteroid curve I and is sufficiently smaller than a threshold value level for magnetic inversion, and in the normal state the data stored in memory cell MC in the half-selected state is not inverted.

For memory cell MCa in the half-selected state connected to a selected digit line DL and a non-selected bit line, a magnetic field induced by a digit line current IDL0 is applied and no magnetic field induced by bit line current IBL0 is applied. Thus, in this case also, a magnetic field applied to memory cell MCa in the half-selected state falls within asteroid curve I, and in the normal state the cell's storage data is not inverted.

For a memory cell in the half-selected state, there are provided a digit line write disturbance margin ΔIDL and a bit line write disturbance margin ΔIBL. This write disturbance margin represents a difference between a threshold value of a magnetic field for inverting stored data and an applied magnetic field. A sufficiently large write disturbance margin can prevent an erroneous write to a memory cell in the half-selected state.

However, as microfabrication is advanced and accordingly a variable magnetoresistive element is reduced in area, a magnitude of its magnetic moment is accordingly reduced and an inversion threshold value of the magnetic field causing magnetization inversion is reduced. Furthermore, as microfabrication is advanced and accordingly a write current is reduced in magnitude, an accordingly smaller magnetic field is induced and writing must be done with the smaller magnetic field. From these factors, a memory cell in the half-selected state has write disturbance margins ΔIDL and ΔIBL reduced. Furthermore, when the clad interconnect structure is employed to intensively supply a magnetic field, a relatively large magnetic field is applied with a small current and accordingly there is a possibility that the memory cell in the half-selected state may have a write disturbance margin further reduced.

As has been described above, when bit line BL and digit line DL shown in FIG. 6 are provided in the clad interconnect structure, a magnetic field is intensively supplied to variable magnetoresistive element VR. Bit line BL has normal cell NMC (indicating normal cells representatively) and reference cell RMC (indicating reference cells genericly) connected thereto, and in writing data to a normal cell reference cell RMC is driven to the half-selected state and supplied with a write current induced magnetic field by the bit line. In this case, if bit line current induced magnetic field write margin ΔIBL as shown in FIG. 7 is small (as the cell is miniaturized in size), then, whenever a data write is repeatedly done, a disturbing magnetic field is applied, and there is a possibility that the storage data of reference cell may be inverted.

As previously shown in FIG. 5, a current, (Imax+Imin)/2, generated by reference cells serves as a reference value for a current for reading data stored in normal cell NMC, and if a storage data of reference cell is inverted, there is a possibility that correct data read cannot be performed. More specifically, if reference cells selected in parallel both attain the high resistance state, the reference current will be (Imin+Imin)/2=Imin, whereas if two reference cells both attain the low resistance state, then the reference current will be Imax. The reference current will thus have the same magnitude as a read current flowing in the high or low resistance state of a normal cell, and data cannot be read.

To hold data of a reference cell reliably for a long term, a write disturbance margin for the reference cell is increased.

Figure 8:
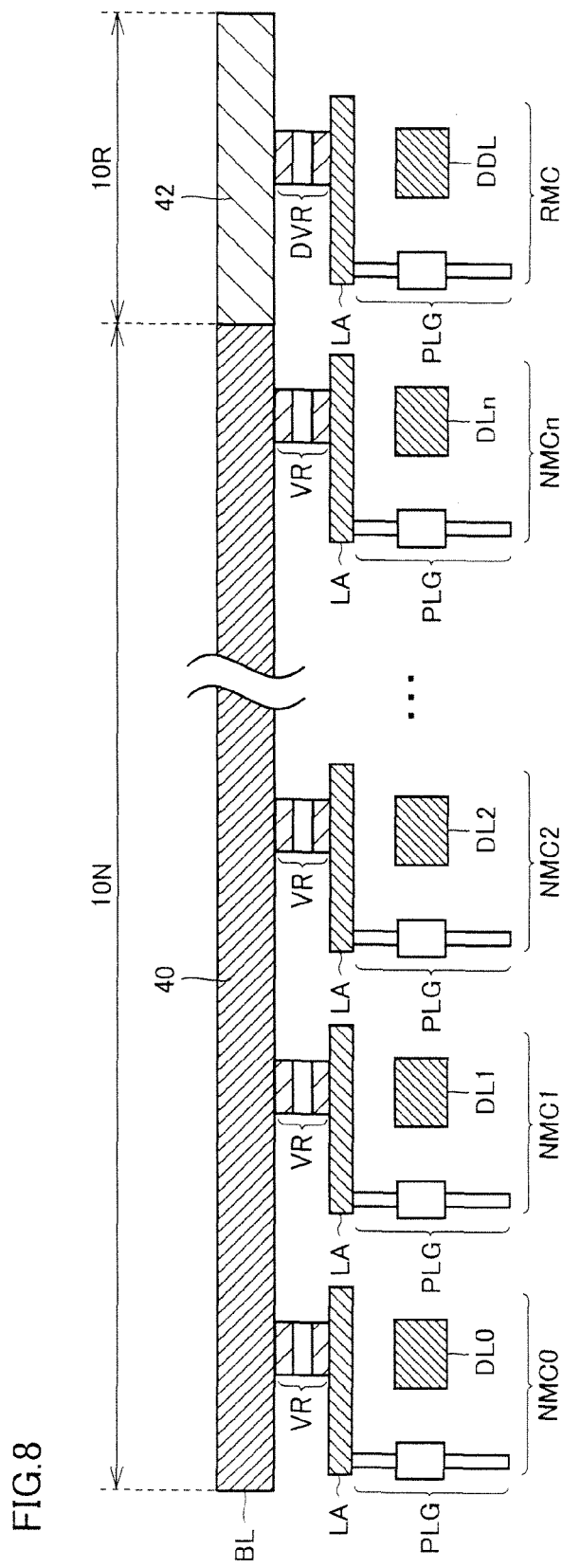
FIG. 8 schematically shows a bit line structure of an MRAM according to a first embodiment of the present invention.

FIG. 8 schematically shows a structure of a bit line according to the first embodiment of the present invention together with memory cells associated therewith. With reference to FIG. 8, bit line BL has normal cells NMC0-NMCn coupled therewith in normal cell region 10N, and in reference cell region 10R reference cell RMC coupled therewith. More specifically, bit line BL has the variable magnetoresistive element VRs of normal cells NMC0-NMCn coupled therewith. Normal cells NMC0-NMCn each have variable magnetoresistive element VR coupled with an associated access transistor (not shown) through local interconnect LA and plug PLG. In normal cells NMC0-NMCn digit lines DL0-DLn are disposed under variable magnetoresistive elements VRs. Digit lines DL0-DLn are provided in a (full) clad interconnect structure, and, as shown in FIG. 6, have a magnetic shield layer (a high permeability film or a soft magnetic film) on the three surfaces other than a side surface facing variable magnetoresistive element VR.

Likewise, reference cell RMC has a dummy variable magnetoresistive element DVR with a top electrode (not shown) connected to bit line BL and a bottom electrode coupled with an underlying dummy access transistor (not shown) via local interconnect LA and plug PLG. Dummy digit line DDL is disposed correspondingly under dummy variable magnetoresistive element DVR. Dummy digit line DDL, as well as digit lines DL0-DLn, has a (full) clad interconnect structure and is covered with a magnetic shield film at the three surfaces other than a side surface facing dummy variable magnetoresistive element DVR.

Bit line BL in normal cell region 10N has a full clad interconnect structure 40 and in reference cell region 10R has a partially clad or unclad interconnect structure 42. In full clad interconnect structure (hereinafter simply referred to as "clad interconnect structure") 40, bit line BL has three surfaces, i.e., upper and horizontal side surfaces other than a surface coupled with variable magnetoresistive element VR, covered with magnetic shield film of high permeability film. The high permeability film is for example a nickel ferrite (NiFe)-based permalloy film. The bit line conductor is formed for example of a copper (Cu) interconnect.

In partially clad or unclad interconnect structure 42, in contrast, bit line BL has upper or side surfaces other than that coupled with dummy variable magnetoresistive element DVR covered with a magnetic shield layer or has no surface covered therewith and has the bit line conductor exposed.

Figure 9:
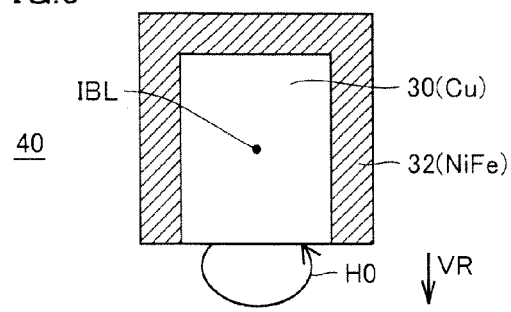
FIG. 9 schematically shows a clad interconnect structure of a bit line in the first embodiment of the present invention.

FIG. 9 schematically shows a structure in cross section of the bit line of the portion of clad interconnect structure 40 shown in FIG. 8. In FIG. 9, clad interconnect structure 40 has conductor 30 formed, for example, of a copper interconnect and passing bit line current IBL therethrough, and magnetic shield film (high permeability film) 32 covering three surfaces of conductor 30, i.e., upper and side surfaces thereof other than a surface facing variable magnetoresistive element VR. In this case, a magnetic field H0 induced by bit line current IBL flowing through conductor 30 is concentrated only at the surface facing variable magnetoresistive element VR and a bit line current induced magnetic field from the directions of the three other surfaces is shielded. This allows magnetic field H0 to be applied to variable magnetoresistive element VR of a normal cell efficiently.

Figure 10:
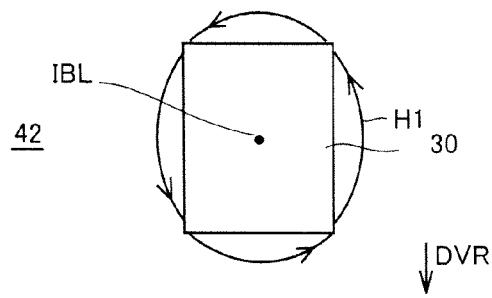
FIG. 10 shows one example of a partially clad or unclad interconnect structure of a bit line according to the first embodiment of the present invention.

FIG. 10 schematically shows a structure in cross section of the bit line of the portion of partially clad or unclad interconnect structure 42 shown in FIG. 8. In FIG. 10, partially clad or unclad interconnect structure 42 has conductor 30 of which four surfaces have no magnetic shield layer formed thereto. Accordingly, when a magnetic field H1 is induced from conductor 30 by bit line current IBL, magnetic field H1 is induced from the four surfaces, i.e., top, bottom, right and left side surfaces, of conductor 30 and concentrates most weakly. Therefore, a magnetic field applied to dummy variable magnetoresistive element DVR facing the bottom surface is the smallest in intensity in this case.

Figure 11:
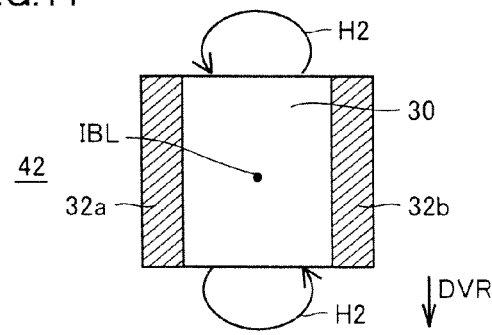
FIG. 11 schematically shows a partially clad interconnect structure of a bit line interconnect structure according to the first embodiment of the present invention.

FIG. 11 schematically shows another exemplary structure in cross section of partially clad or unclad interconnect structure 42 shown in FIG. 8. In the FIG. 11 structure, conductor 30 has side surfaces provided with magnetic shield layers 32a and 32b, and an upper surface with no magnetic shield film. Conductor 30 has a bottom plane at a surface facing to and provided with variable magnetoresistive element DVR. In this configuration, conductor 30 has right and left side surfaces magnetically shielded by magnetic shield layers 32a and 32b and bit line current IBL induces a magnetic field H2 from conductor 30 at the upper and bottom plane surfaces. Thus in this case no magnetic field is induced at the two side surfaces and magnetic field H2 stronger than in the FIG. 10 structure is supplied to dummy variable magnetoresistive element DVR.

Figure 12:
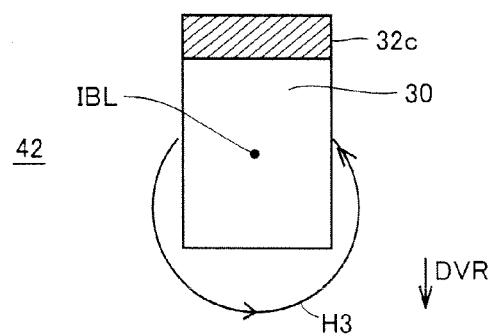
FIG. 12 schematically shows a partially clad interconnect structure of a bit line structure according to the first embodiment of the present invention.

FIG. 12 schematically shows a structure in cross section of partially clad or unclad interconnect structure 42 shown in FIG. 8. In FIG. 12, a conductor 32 has an upper surface provided with magnetic shield layer 32c. In this case, the conductor has opposite side surfaces and a bottom surface with no magnetic shield film thereto. A magnetic field H3 supplied by bit line current IBL is all supplied to dummy variable magnetoresistive element DVR disposed facing the bottom surface. No magnetic flux is induced to the upper surface, and magnetic field H3 stronger than that in the interconnect structure shown in FIG. 11 is supplied to dummy variable magnetoresistive element DVR.

Of the configurations of FIGS. 9 to 12, the FIGS. 10 to 12 partially clad or unclad interconnect structures 42 each apply from each side to dummy variable magnetoresistive element DVR a magnetic field smaller in intensity than magnetic field H0 induced by the (full) clad interconnect structure 42 shown in FIG. 9. Of the FIGS. 10-12 structures, the magnetic field to be applied to dummy variable magnetoresistive element DVR becomes weaker in intensity in the sequence of the FIG. 12 structure, FIG. 11 structure and the FIG. 10 structure. Thus the FIG. 10 structure most effectively suppresses a write disturbance on the reference cell and the FIG. 12 structure least effectively does so. In this case, when the write disturbance suppressing effect of the FIG. 10 interconnect structure assumes a value of one (1), the suppressing effect of the FIG. 11 interconnect structure assumes a value of approximately 0.8-0.9 and that of the FIG. 12 interconnect structure assumes a value of approximately 0.6-0.7.

Figure 13:
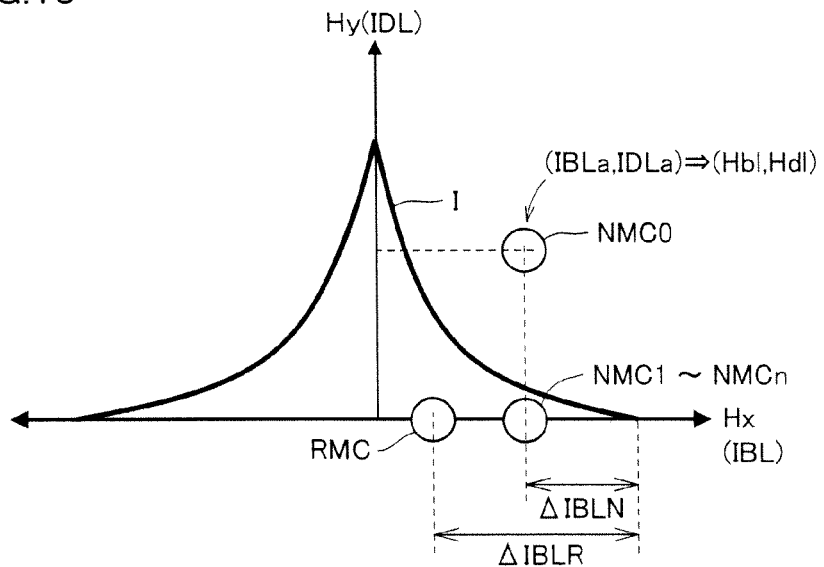
FIG. 13 schematically shows a write margin of a reference cell in the bit line interconnect structure shown in FIG. 8.

FIG. 13 shows a relationship among a magnetic field applied to reference cell RMC, a selected memory cell and a half-selected memory cell in a hit line structure according to the first embodiment of the present invention, together with an asteroid curve. For a selected normal cell NMC0, magnetic fields Hb1 and Hd1 induced by a bit line write current IBLa and a digit line write current IDLa are applied. In this case, a magnetic field outside asteroid curve I is applied to selected normal cell NMC0 and data can be written to selected normal cell NMC0.

For normal cells NMC1-NMCn on a selected bit line in the half-selected state, a digit line (DL) is in the non-selected state and magnetic field Hd1 induced by a current flowing through bit line IBL is applied. Thus, half-selected normal cells NMC1-NMCn will have a write disturbance margin ΔIBLn.

For reference cell RMC, with a bit line having the partially clad or unclad interconnect structure, bit line current IBLa induces a magnetic field Hxr sufficiently smaller than magnetic field Hb1 applied to a normal cell in the half-selected state. Thus, when bit line current IBLa flows through an associated bit line and reference cell RMC is set to the half-selected state, it can have a write disturbance margin ΔIBLR sufficiently larger than write disturbance margin ΔIBLn for normal cells NMC1-NMCn in the half-selected state. Reference cell RMC can be prevented from having its storage data inverted to allow the cell to hold the storage data for a long term reliably, and thus a reliable data read is ensured.

Figure 14:
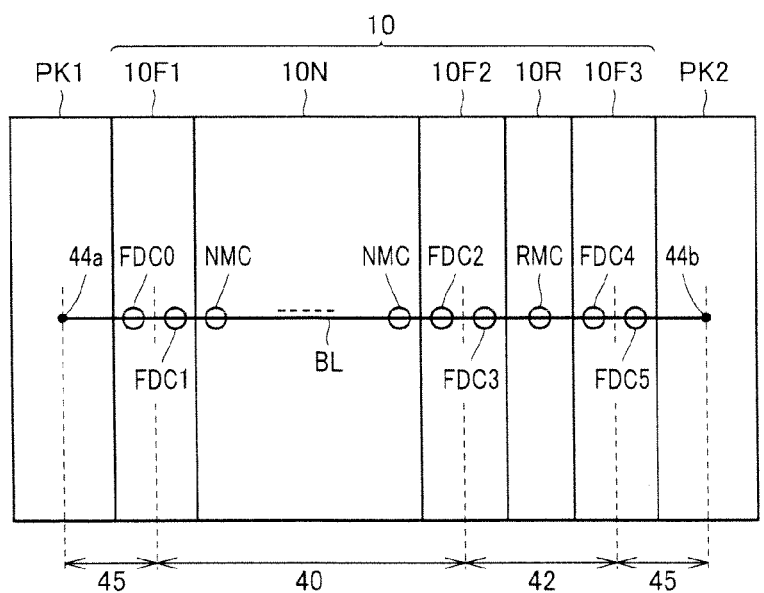
FIG. 14 shows one example of the arrangement of reference cells in the MRAM according to the first embodiment of the present invention.

FIG. 14 schematically shows a distribution of bit line structures in memory cell array 10. In FIG. 14, memory cell array 10 has peripheral circuit regions PK1 and PK2 formed at opposite sides. Peripheral circuit regions PK1 and PK2 have a read column select circuit, a bit line write driver and others disposed therein. Memory cell array 10 includes normal cell region 10N having normal cell NMC disposed therein, reference cell region 10R having reference cell RMC disposed therein, geometry dummy cell regions 10F1 and 10F2 disposed sandwiching memory cell array 10, and a geometry dummy cell region 10F3 disposed between reference cell region 10R and peripheral circuit region PK2.

Geometry dummy cell regions 10F1-10F3 are provided to maintain a regularity of a pattern of memory cells (normal and reference cells) and prevent the pattern misalignment in these memory cells during the fabrication process. Geometry dummy cell regions 10F1-10F3 have geometry dummy cells identical in geometry or feature to memory cells (normal and reference cells) disposed therein. The geometry dummy cells are provided to simply maintain the pattern's regularity and are not used in an actual memory operation (i.e., data write/read operation).

Geometry dummy cell region 10F1 has two rows of geometry dummy cells FDC0 and FDC1 disposed therein and geometry dummy cell region 10F2 has two rows of geometry dummy cells FDC2 and FDC3 disposed therein. Likewise, geometry dummy cell region 10F3 has two rows of geometry dummy cells FDC4 and FDC5 disposed therein. These cells share bit line BL, and bit line BL extends so as to have its ends 44a and 44b laid in peripheral circuit regions PK1 and PK2.

Bit line BL has clad interconnect structure 40 in a region from geometry dummy cell FDC1 in geometry dummy cell region 10F1 to geometry dummy cell FDC2 in geometry dummy cell region 10F2. Bit line BL has partial clad interconnect structure 45 in a region from geometry dummy cell FDC0 in geometry dummy cell region 10F1 to the hit line end 44a.

Bit line BL between geometry dummy cell FDC3 in geometry dummy cell region 10F2 and geometry dummy cell FDC4 in geometry dummy cell region 10F3 has partially clad or unclad interconnect structure 42. Bit line BL from geometry dummy cell FDC5 in geometry dummy cell region 10F3 to the bit line end 44b has partially clad interconnect structure 45.

The bit line interconnect structure is made the same for geometry dummy cells FDC1 and FDC2 adjacent to normal cell NMC of normal cell region 10N to prevent a pattern misalignment in the bit line interconnect structure for normal cells NMC.

In peripheral circuit regions PK1 and PK2, bit line BL is connected to a component of a peripheral circuit and at this portion the partially clad interconnect structure is utilized. While a bit line write current flows, a bit line write current induced magnetic field can be prevented from negatively affecting a peripheral circuit's operation. The interconnect structure of bit line BL for geometry dummy cells FDC0 and FDC5 is made the same as the partially clad interconnect structure for bit line BL in peripheral circuit regions PK1 and PK2, and peripheral circuit regions PK1 and PK2 can be reliably prevented from causing the pattern misalignment in the bit line interconnect structure.

Furthermore, the interconnect structure of bit line BL for geometry dummy cells FDC3 and FDC4 adjacent to reference cell RMC is formed into partially clad or unclad interconnect structure 42, similarly to that of bit line BL for reference cell RMC, and the interconnect structure of bit line BL for reference cell RMC can be reliably formed into the partially clad or unclad interconnect structure, to suppress variation of a magnetic shield effect for reference cell RMC due to pattern process variation, and a write disturbance magnetic field for reference cell RMC can be limited.

Exemplary Variation

Figure 15:
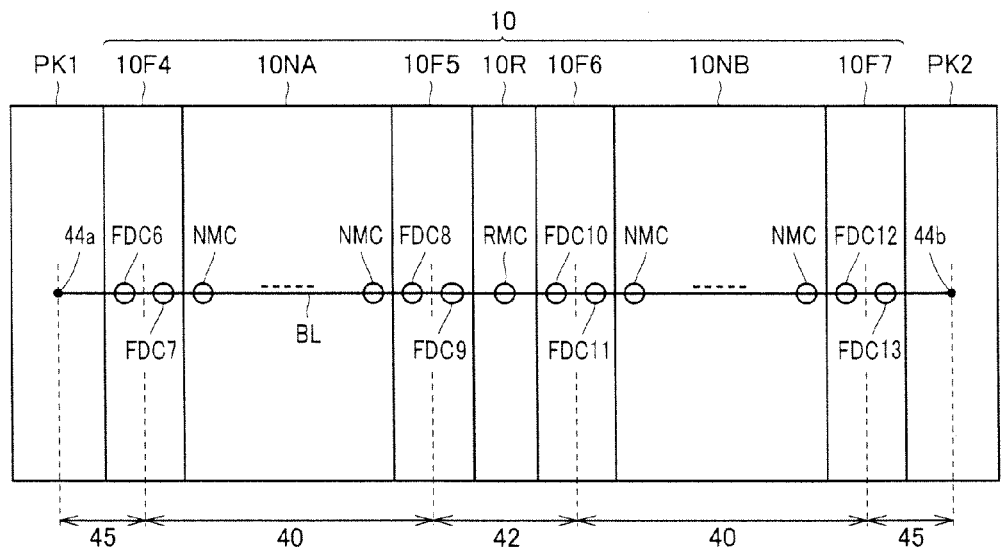
FIG. 15 shows another example of the arrangement of reference cells in the MRAM according to the first embodiment of the present invention.

FIG. 15 schematically shows an exemplary variation of arranging memory cell array 10 of the MRAM according to the first embodiment of the present invention. In FIG. 15, memory cell array 10 has a normal cell region IONA having opposite sides, as seen in the column direction, adjacent to geometry dummy cell regions 10F4 and 10F5 and a normal cell region 10NB having opposite sides, as seen in the column direction, adjacent to geometry dummy cell regions 10F6 and 10F7. Memory cell array 10 is provided with a reference cell region 10R at a center between geometry dummy cell regions 10F5. Peripheral circuit regions PK1 and PK2 are disposed outside geometry dummy cell regions 10F4 and 10F7. The provision of reference cell region 10R at the center of memory cell array can reduce variation in resistance values of reference cells to generate a correct reference current for reading data.

Geometry dummy cell region 10F4 has two rows of geometry dummy cells FDC6 and FDC7 disposed therein and geometry dummy cell region 10F5 has geometry dummy cells FDC8 and FDC9 disposed therein. Geometry dummy cell region 10F6 has two rows of geometry dummy cells FDC10 and FDC11 disposed therein and geometry dummy cell region 10F7 has two rows of geometry dummy cells FDC12 and FDC13 disposed therein. Cells NMC, RMC, and FDC6-FDC13 aligned in the column direction share bit line BL. Bit line BL has ends 44a and 44b in peripheral circuit regions PK1 and PK2, respectively.

In the FIG. 15 array arrangement, bit line BL has partially clad interconnect structure 45 at a portion from end 44a to geometry dummy cell FDC6, clad interconnect structure 40 in a portion between geometry dummy cell FDC7 and geometry dummy cell FDC8, and partially clad or unclad interconnect structure 42 in a region between geometry dummy cell FDC9 and geometry dummy cell FDC10. Bit line BL has clad interconnect structure 40 at a portion between geometry dummy cells FDC11 and FDC12, and partially clad interconnect structure 45 at a portion between geometry dummy cell FDC13 and end 44b.

In the array arrangement shown in FIG. 15, due to geometry dummy cells FDC7, FDC8, FDC11 and FDC12 adjacent to normal cell NMC, regularity in the interconnect structure of bit line BL can be maintained to make patterning of bit line clad interconnect structures correctly for normal cell NMC. Furthermore, geometry dummy cells FDC9 and FDC10 arranged sandwiching reference cell RMC and the partially clad or unclad interconnect structure can be correctly formed for reference cell RMC. Furthermore, geometry dummy cells FDC6 and FDC13 ensure the formation of the partially clad interconnect structure for bit line BL in peripheral circuit regions PK1 and PK2 to reliably reduce or prevent a negative effect on peripheral circuit regions PK1 and PK2 due to pattern misalignment (e.g., an interconnect patterning variation, a defective operation due to a write current induced magnetic field, and the like).

Thus the present invention in the first embodiment provides a bit line interconnect structure in a partially clad or unclad interconnect structure for a reference cell that stores data invariably and generates a reference current in a data read. This can reduce the intensity of a magnetic field applied to the reference cell in a data write to increase write disturbance margin therefor.

Second Embodiment

Figure 16:
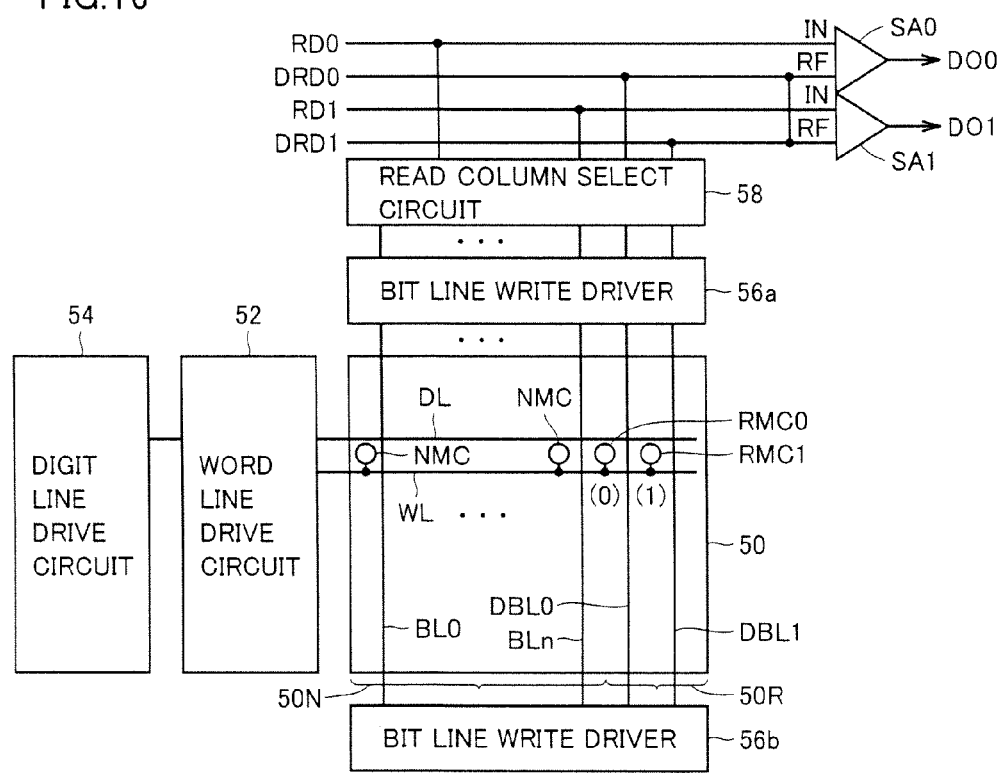
FIG. 16 schematically shows another configuration of the subarray of the MRAM according to the first embodiment of the present invention.

FIG. 16 schematically shows a configuration of a subarray of an MRAM according to a second embodiment of the present invention. In FIG. 16, the subarray includes a memory cell array 50. Memory cell array 50 has normal cell NMC and reference cell RMC aligned in the row direction. Reference cell RMC includes a reference cell RMC0 storing data of "0" and a reference cell RMC1 storing data of "1".

Word line WL and digit line DL are provided for each row of normal cells NMC and reference cells RMC0 and RMC1. Bit lines BL0-BLn are disposed for each column of normal cell NMC and dummy bit lines DBL0 and DBL1 are disposed for each column of reference cells RMC0 and RMC1.

A word line drive circuit 52 and a digit line drive circuit 54 are provided to drive word line WL and digit line DL, respectively, to the selected state. In data reading, word line drive circuit 52 operates in response to a row address signal (not shown) (or a signal on a main word line) to drive word line WL of a selected row to the selected state. In data writing, word line drive circuit 52 maintains all word lines WLs in the non-selected state. In data writing, digit line drive circuit 54 operates in response to a row address signal (not shown) (or a signal on a main word line) to pass a current through digit line DL of a selected row in a predetermined direction. In data reading, digit line drive circuit 54 maintains all digit lines DLs in the non-selected state.

Bit line write drivers 56a and 56b are provided at the opposite ends of bit lines BL0-BLn and dummy bit lines DBL0, DBL1. Similarly to the first embodiment as described, bit line write drivers 56a and 56b operate in response to a column select signal and write data to pass a write current through a bit line of a selected column in a direction according to the write data.

Furthermore, a read column select circuit 58 is provided corresponding to bit lines BL0-BLn and reference cells RMC0 and RMC1. In data reading, read column select circuit 58 selects and couples bit lines on selected columns of two columns with read data buses RD0 and RD1, respectively. Furthermore, read column select circuit 58, in data reading, couples dummy bit lines DBL0 and DBL1 with reference read data buses DRD0 and DRD1, respectively. Sense amplifier SA0 is provided for read data buses RD0 and DRD0, and sense amplifier SA1 is provided for read data buses RD1 and DRD1. Sense amplifiers SA0 and SA1 have their respective reference inputs RFs interconnected, and compare, in magnitude, currents received at reference inputs RFs and those received at their respective data inputs INs (or perform differential amplification) to generate internal read data DO0 and DO1, respectively.

Sense amplifiers SA0 and SA1 may be provided for each subarray and their outputs may further be amplified in a main amplifier shared by memory mats.

In the FIG. 16 configuration also, in data reading, reference cells RMC0 and RMC1 are always selected regardless of where a selected normal cell column is located to generate reference current (Imax+Imin)/2. In data write, a write current flows through digit line DL of a selected row and a writing magnetic field is induced at normal cell NMC and reference cells RMC0 and RMC1. In this case, reference cells RMC0 and RMC1 generate a reference current for reading data and accordingly, it is necessary to maximize their write disturbance margin.

Figure 17:
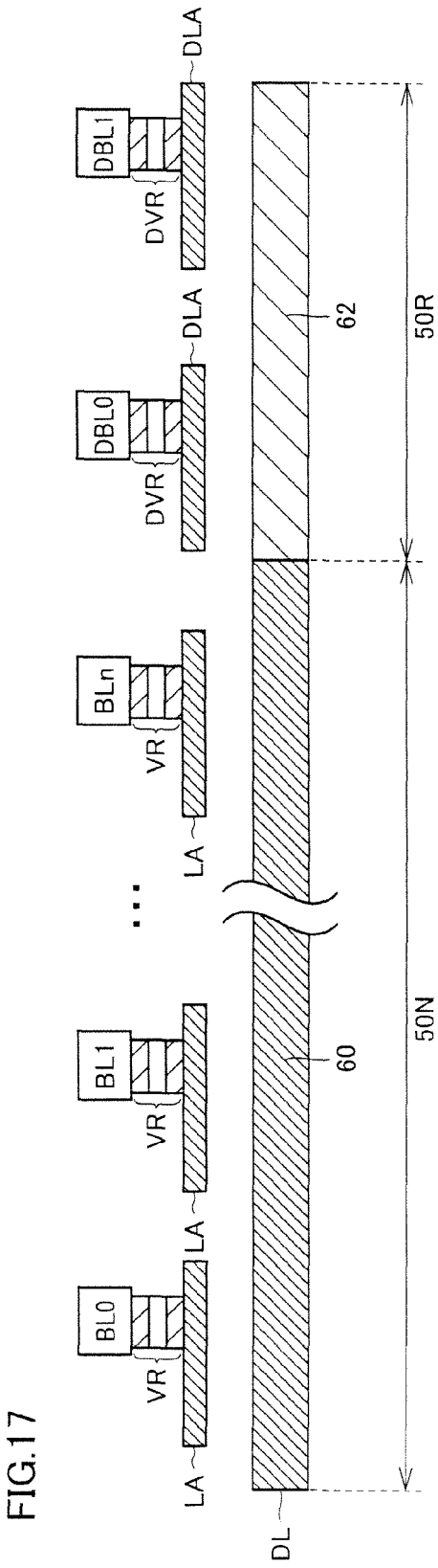
FIG. 17 schematically shows an interconnect structure of a digit line according to a second embodiment of the present invention.

FIG. 17 schematically shows a structure in cross section of a single digit line DL in memory cell array 50 shown in FIG. 16. Digit line DL continuously extends across a normal cell region 50N and a reference cell region 50R. In normal cell region 50N, bit lines BL0-BLn are spaced each other at predetermined interval in a direction orthogonal to digit line DL and variable magnetoresistive element (TMR element or MTJ element) VR is disposed in contact with corresponding hit line BL0-BLn. Variable magnetoresistive element VR is disposed on local interconnect LA. Reference cell region 50R also has disposed therein dummy bit lines DBL0 and DBL1 spaced each other at predetermined intervals in a direction orthogonal to digit line DL. Dummy variable magnetoresistive element DVR having storage information fixed is coupled with dummy bit line DBL0 and dummy variable magnetoresistive element DVR is disposed on a local interconnect DLA.

Digit line DL is disposed under local interconnect LA and local interconnect DLA. Digit line DL has a clad interconnect structure 60 in normal cell region 50N and has a partially clad or unclad interconnect structure 62 in reference cell region 50R.

Digit line DL has an interconnect structure changed for normal cell region 50N and for reference cell region 50R a digit line current induced magnetic field is reduced in intensity to be applied to dummy variable magnetoresistive element DVR in reference cell region 50R in data writing.

Figure 18:
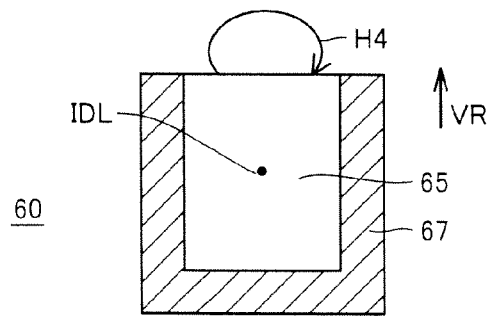
FIG. 18 schematically shows a clad interconnect structure of the digit line interconnect structure shown in FIG. 17.

FIG. 18 schematically shows clad interconnect structure 60 of the FIG. 17 digit line DL. In FIG. 18, digit line clad interconnect structure 60 is configured for example of copper and includes a conductor 65 passing a digit line current therethrough and magnetic shield film (high permeability film or soft magnetic film) 67 configured for example of nickel ferrite (NiFe) and covering the three surfaces of conductor 65 other than the upper surface thereof. A variable magnetoresistive element VR of a normal cell is disposed on the upper surface of conductor 65 with local interconnect LA interposed. When digit line current IDL is passed, a magnetic field H4 is intensively generated only for the upper surface and a large magnetic field can be applied to variable magnetoresistive element VR of the normal cell with high efficiency.

Figure 19:
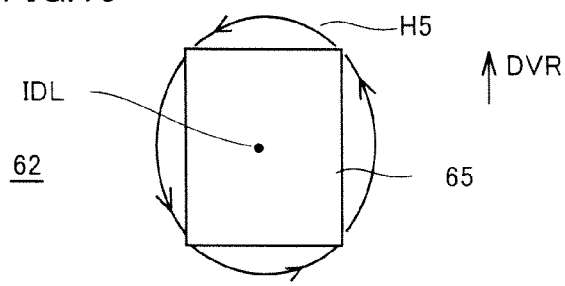
FIG. 19 shows one example of a partially clad or unclad interconnect structure of the FIG. 17 digit line interconnect structure.

FIG. 19 schematically shows partially clad or unclad interconnect structure 62 of digit line DL shown in FIG. 17. As shown in FIG. 19, partially clad or unclad interconnect structure 62 is formed of conductor 65 passing a digit line current therethrough. No magnetic shield film is provided, i.e., digit line DL has an unclad interconnect structure, and conductor 65 has its four surfaces exposed. In the FIG. 19 configuration, digit line write current IDL induces a magnetic field H5, which is dispersed in the directions of the four surfaces of conductor 65 and is not concentrated locally, and a reduced magnetic field is applied to variable magnetoresistive element DVR of a reference cell.

Figure 20:
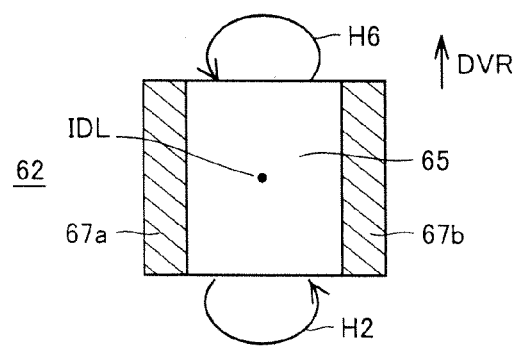
FIG. 20 shows another example of the partially clad or unclad interconnect structure of the digit line interconnect structure shown in FIG. 17.

FIG. 20 schematically shows another configuration of partially clad or unclad interconnect structure 62 shown in FIG. 17. In FIG. 20, partially clad or unclad interconnect structure 62 includes conductor 65 passing a digit line current therethrough and magnetic shield films 67a and 67b provided on conductor 65 at opposite surfaces other than upper and bottom surfaces. For the partially clad interconnect structure shown in FIG. 20, a reference cell has dummy variable magnetoresistive element DVR above the upper surface of conductor 65. When digit line current IDL flows, a magnetic field H6 is derived from conductor 65 at the surfaces excluding the side surfaces, i.e., the upper and bottom surfaces. A magnetic flux density is reduced for the overlying dummy variable magnetoresistive element DVR and accordingly, a weakened magnetic field is applied thereto. As compared with the FIG. 19 configuration, a magnetic field concentration is achieved at the conductor's side surfaces and hence the magnetic field is made larger in intensity.

Figure 21:
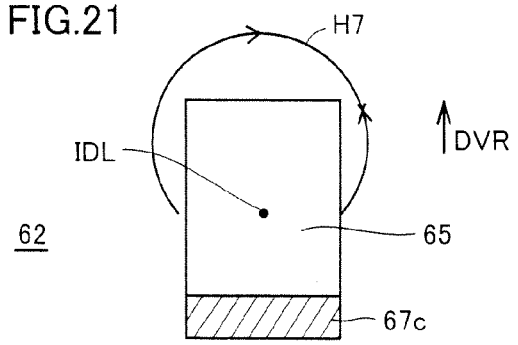
FIG. 21 shows still another configuration of the partially clad or unclad interconnect structure of the digit line interconnect structure shown in FIG. 17.

FIG. 21 shows still another configuration of partially clad or unclad interconnect structure 62 of the digit line shown in FIG. 17. In the configuration shown in FIG. 21, the interconnect structure is formed into a partially clad interconnect structure in which conductor 65 has a bottom with magnetic shield film 67c and the remaining, side and upper surfaces with no magnetic shield film. With this structure, when digit line current IDL flows, a magnetic flux is derived from conductor 65 at the side and upper surfaces and a magnetic field H7 is applied to the overlying dummy variable magnetoresistive element DVR intensively in one direction. This configuration thus applies a magnetic field larger in intensity than the configurations of FIGS. 19 and 20. It should be noted, however, that as compared to the FIG. 18 clad interconnect structure 60, due to a magnetic field derived from side surfaces a magnetic field is made smaller in intensity in the structure of FIG. 21.

The unclad interconnect structure (refer to FIG. 19) and partially clad interconnect structure (refer to FIG. 20 or FIG. 21) are utilized to reduce a digit line current write margin for a reference cell. Their magnetic field reduction effects are similar to that of the partially clad or unclad interconnect structure for a bit line as has been described previously. Specifically, with the suppressing effect of the FIG. 19 interconnect structure being one (1), the suppressing effect of the FIG. 20 interconnect structure assumes approximately 0.8-0.9 and that of the FIG. 21 interconnect structure assumes approximately 0.6-0.7.

Figure 22:
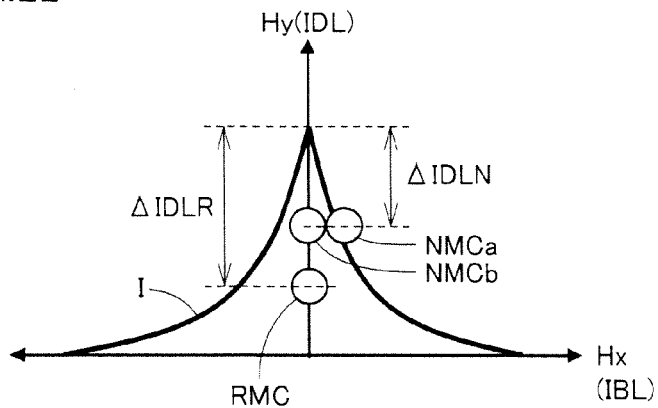
FIG. 22 schematically shows a digit line write current margin in the second embodiment of the present invention.

FIG. 22 schematically represents a digit line write disturbance margin by a digit line write current. In FIG. 22, the axis of abscissas represents magnetic field Hx that bit line current IBL generates and the axis of ordinates represents magnetic field Hy that digit line current IDL generates. Data is written to a memory cell when a combined magnetic field intensity outside the asteroid curve I is applied. It is assumed now that normal cell NMCa is a selected cell and data is written thereto. To a normal cell NMCb on the same row as and a column different from selected normal cell NMCa, magnetic field Hy induced by digit line current IDL is applied and magnetic field Hx induced by bit line current IBL is not applied. Accordingly, in this case, selected normal cell NMCb has a digit line write disturbance margin amount ΔIDLN.

In contrast, for reference cell RMC digit line current IDL flows and in that case a magnetic field is induced having an intensity smaller than that applied to the half-selected normal cell MNCb and reference cell RMC has a digit line write disturbance margin amount ΔIDLR further larger than that of normal cell NMCb in the half-selected state.

Formation of a digit line into a partially clad or unclad interconnect structure for a reference cell allows an applied magnetic field intensity to be smaller than that of a normal cell in the half-selected state. This can prevent the reference cell from having its data inverted and allows the stored data to be reliably held and a data read to be done with an appropriate reference current generated.

Thus the present invention in the second embodiment provides a digit line having a partially clad or unclad interconnect structure for a reference cell attaining the half-selected state on the digit line. This can reduce the intensity of a magnetic field applied to the reference cell in a write, resulting in an increased digit line write disturbance margin.

If normal and reference cells are disposed mixedly in a memory array then, similarly as has been described in the first embodiment, their geometry dummy cells are disposed depending on where the reference cells are positioned. For the geometry dummy cells, the digit line has an interconnect structure identical to a bit line interconnect structure for geometry dummy cells as indicated in the first embodiment.

Furthermore, the first and second embodiments may be combined together and bit and digit lines may both have a partially clad or unclad interconnect structure for a reference cell.

Third Embodiment

Figure 23:
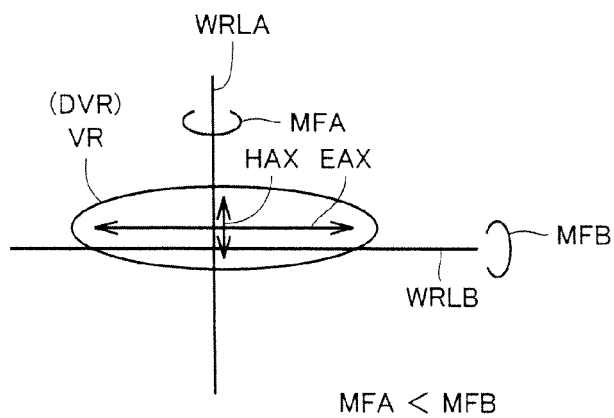
FIG. 23 schematically shows a correspondence of a writing magnetic field to easy and hard axes of magnetization of a memory cell according to a third embodiment of the present invention.

FIG. 23 schematically shows a direction of magnetization of a variable magnetoresistive element of an NRAM cell according to a third embodiment of the present invention. Variable magnetoresistive element VR has a free layer having easy and hard axes of magnetization EAX and HAX, respectively, due to magnetic anisotropy. When a magnetic field is applied along the easy axis of magnetization, the direction of magnetization (or magnetic moment) of the free layer of variable magnetoresistive element VR (or DVR) is easily inverted. In contract, when a magnetic field is applied along the hard axis of magnetization HAX, the direction of magnetic moment (or magnetization) of variable magnetoresistive element VR (or DVR) is not easily inverted.

The third embodiment provides a first write current supply line WRLA parallel to the hard axis of magnetization HAX and a second write current supply line WRLB along the easy axis of magnetization EAX. In this condition, first write current supply line WRLA induces a magnetic field MFA in a direction orthogonal to a current flowing through first write current supply line WRLA and thus focus magnetic field MFA in a direction parallel to the easy axis of magnetization EAX. On the other hand, second write current supply line WRLB generates, by its write current, a magnetic field MFB in a direction parallel to the hard axis of magnetization HAX. Of these orthogonal magnetic fields MFA and MFB, the magnetic field parallel to the hard axis of magnetization HAX, i.e., magnetic field MFB, is made stronger than magnetic field MFA (i.e., MFB>MFA). This intensity relationship can minimize an erroneous write of variable magnetoresistive element VR (or DVR) in the half-selected state and allows an increased write disturbance margin and accordingly, can prevent a reference cell from having its storage data inverted.

As the easy axis of magnetization EAX and the hard axis of magnetization HAX are orthogonal to each other, write current supply lines WRLA and WRLB are also disposed orthogonal to each other. Write current supply lines WRLA and WRLB may be used as digit and bit lines, respectively, or bit and digit lines, respectively, depending on the axial direction of variable magnetoresistive element VR (or DVR). A write current that flows through second write current supply line WRLB is set to be larger than that flowing through first write current supply line WRLA. In this case, a bit line is disposed adjacent to variable magnetoresistive element VR (or DVR) whereas digit line DL is disposed remote from variable magnetoresistive element VR (or DVR). Accordingly, the write currents flowing through write current supply lines WRLA and WRLB generating magnetic fields MFA and MFB has only to be determined in magnitude, as appropriate, with the above distance relationship also considered.

Figure 24:
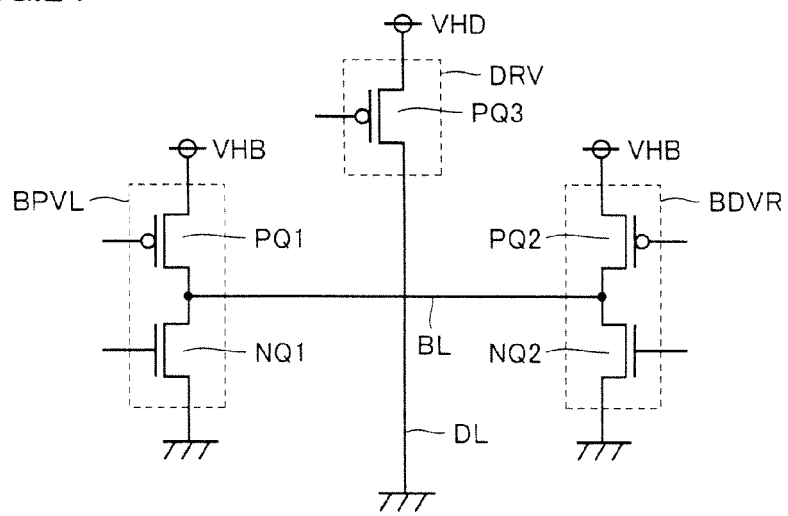
FIG. 24 schematically shows a configuration of peripheral circuitry for bit and digit lines of an MRAM according to the third embodiment of the present invention.

Specifically, as shown in FIG. 24, a bit line write driver has bit line write drive circuits BDVL and BDVR at the opposite sides of bit line BL. A digit line driver has a digit line drive circuit DRV at one end of digit line DL. Digit line DL has the other end coupled with a ground node.

Bit line write drive circuit BDVL includes a p-channel MOS transistor (an insulated gate field effect transistor) PQ1 and an n-channel MOS transistor NQ1, and bit line write drive circuit BDVR includes a p-channel MOS transistor PQ2 and an n-channel MOS transistor NQ2. Digit line driver DRV includes a p-channel MOS transistor PQ3.

In data writing, one of bit line write drive circuits BDVL and BDVR supplies bit line BL with a current and the other discharges a current from bit line BL to ground node. Digit line drive circuit DRV supplies a current from a reference power supply node VHD to digit line DL when MOS transistor PQ3 is turned on. Bit line write drive circuits BDVL and BDVR supply a current to bit line BL from their reference power supply node VHB. Adjusting the voltage level of reference power supply nodes VHD and VHB and the current driving capabilities of MOS transistors PQ1-PQ3 and NQ1 and NQ2 (i.e., a size: a ratio of gate width to gate length) can adjust the amounts of currents flowing through bit and digit lines BL and DL, and hence the respective intensities of the write current induced magnetic fields of the bit and digit lines.

Thus the present invention in the third embodiment supplies write currents such that a magnetic field intensity along the easy axis of magnetization of variable magnetoresistive elements VR and DVR is smaller than that along the hard axis of magnetization thereof. Thus a reference cell in the half selected state can be less likely to be subject to magnetization inversion, and an increased write disturbance margin can be achieved.

Fourth Embodiment

FIG. 25 schematically shows an arrangement of digit and bit lines of a semiconductor device according to a fourth embodiment of the present invention. With reference to FIG. 25, normal cell NMC and reference cell RMC share bit line BL. Digit line DL is provided for normal cell NMC and dummy digit line DDL is disposed for reference cell RMC. A digit line peripheral circuit 70 is disposed at end portions of digit line DL and dummy digit line DDL. Digit line peripheral circuit 70 is a digit line driver, which operates in response to a row address signal to couple digit lines DL and DDL with a power supply node or with a ground node fixedly.

Digit line DL and dummy digit line DDL are formed into a clad interconnect structure and a partially clad or unclad interconnect structure, respectively. To pattern magnetic shield film precisely through the line to the end, the digit line at the peripheral circuit portion has a clad interconnect structure. Dummy digit line DDL at the peripheral circuit portion has a partially clad or unclad interconnect structure. A common pattern is continuously formed to prevent pattern misalignment.

In the FIG. 25 arrangement, digit line DL has normal cell NMC connected thereto and has a clad interconnect structure, and dummy digit line DDL has reference cell RMC connected thereto and has an unclad interconnect structure. Hereinafter, the direction in which digit line DL extends will be referred to as a "DL direction" and that in which bit line BL extends will be referred to as a "BL direction." The arrangement of normal cell NMC and reference cell RMC shown in FIG. 25 corresponds to the FIG. 5 arrangement of the memory cell array. Now, description is provided on a process for fabricating digit line DL and dummy digit line DDL in a clad interconnect structure and an unclad interconnect structure, respectively.

FIG. 26(A) illustrates a structure in cross section of a digit line formation portion in the BL direction. In the following, description is made on a fabricating process for a portion in association with formation of digit line DL and dummy digit line DDL. An access transistor is fabricated in an underlying region (not shown). Furthermore, in the following description, identical components in the figures are identically denoted and accordingly, will not be described duplicatedly, as appropriate.

With reference to FIG. 26(A), an intermediate plug 82a is provided for connection to an underlying interconnect, and interlayer insulation films 80a and 80b are provided at the opposite sides of intermediate plug 82a. Intermediate plug 82a has three surfaces other than an upper surface surrounded by a barrier layer 81a. As a copper interconnect is employed, barrier layer 81a is introduced to prevent diffusion of copper atoms and others.

Sputtering or the like is employed to form copper diffusion prevention films 84a and 84b on a partial region of interlayer insulation films 80a and 80b and intermediate plug 82a. As the intermediate plug and the digit, dummy digit and bit lines are formed with the copper interconnect, diffusion prevention films 84*a* and 84*b* are introduced to prevent diffusion of copper through the interlayer insulation films. The copper interconnect is formed through plasma CVD or electrolytic plating method (i.e., by providing a copper seed film and then performing electrolytic plating to deposit copper film).

A through hole 90*a* is provided on intermediate plug 82*a*. Interlayer insulation films 86*a* and 86*b* are provided on copper diffusion prevention films 84*a* and 84*b*. Interlayer insulation films 86*a* and 86*b* are provided with recess regions 89*a* and 89*b* for disposing digit and reference digit lines, and through hole 90*a* is provided for connection to an underlying interconnect. A barrier film 88 of tantalum (Ta) or tantalum nitride (TaN) is formed through for example sputtering or plasma CVD method on a surface of interlayer insulation films 86*a* and 86*b*.

Barrier film 88 is provided as a base barrier film in forming a copper interconnect, and it is used to prevent diffusion of copper and increased current leakage between interconnects due to diffusion of copper and is also used as an etching stopper to provide an interconnect geometrically homogenized in cross section. Barrier film 88 is also provided on a surface of through hole 90*a* in contact with intermediate plug 82*a*.

FIG. 26(B) schematically shows a structure in cross section of recess region 89*a* (89*b*) in the DL direction in the FIG. 26(A) fabrication process. In the DL direction, interlayer insulation film 80, copper diffusion prevention films 84, interlayer insulation film 86, and barrier film 88 are stacked each other in this order.

FIG. 26(C) schematically shows a structure in cross section of a digit line formation portion in the BL direction in a region for providing peripheral circuit 70, i.e., a peripheral region, in the FIG. 26(A) fabrication process.

With reference to FIG. 26(C), an intermediate interconnect 82*b* is provided for electrical connection to a component of an underlying peripheral circuit, and interlayer insulation films 80*c* and 80*d* are provided at the opposite sides of intermediate interconnect 82*b*. Intermediate interconnect 82*b* has a bottom and side surfaces provided with a barrier film 80*c*. On intermediate interconnect 82*b*, a through hole 90*b* is provided for connection to a digit line.

Copper diffusion prevention films 84*c* and 84*d* are provided on interlayer insulation films 80*c* and 80*d* and intermediate interconnect 82*b*. Through hole 90*b* has opposite sides provided with interlayer insulation films 86*c* and 86*d*, and interlayer insulation films 86*c* and 86*d* and intermediate interconnect 82*b* each have a surface provided with barrier film 88.

FIGS. 27(A) to 27(C) show a structure in cross section of each corresponding portion in a process subsequent to a process step shown in FIGS. 26(A) to 26(C). In FIG. 27(A), recess region 89*b* is masked and for example sputtering is employed to deposit high permeability film of nickel ferrite (NiFe) film. The NiFe film having high permeability thus provided allows through hole 90*a* and recess region 89*a* to have each surface provided with high permeability film to form magnetic shield film. Subsequently, the mask of recess region 89*b* is etched away to expose barrier film 88 in recess region 89*b*.

In FIG. 27(B), high permeability film 92 is provided on barrier film 88 over the entire surface in the DL direction. Although not shown in the figure, high permeability film 92 is not provided for dummy digit line DDL, as the masking is made.

As shown in FIG. 27(C), a digit line (DL) peripheral circuit region is also provided with high permeability film 92 on through hole 90*b* as magnetic shield film. The NiFe film utilized as the magnetic shield film is electrically conductive, low resistance alloy film and does not have any negative effect on electrical connection of an interconnect in the peripheral circuit region.

The peripheral region (refer to FIG. 27(C)) and a portion of an interconnect to an access transistor in a memory cell portion (refer to FIGS. 27(A) and 27(B)) are formed structurally identically to prevent a misaligned pattern.

Figure 28:
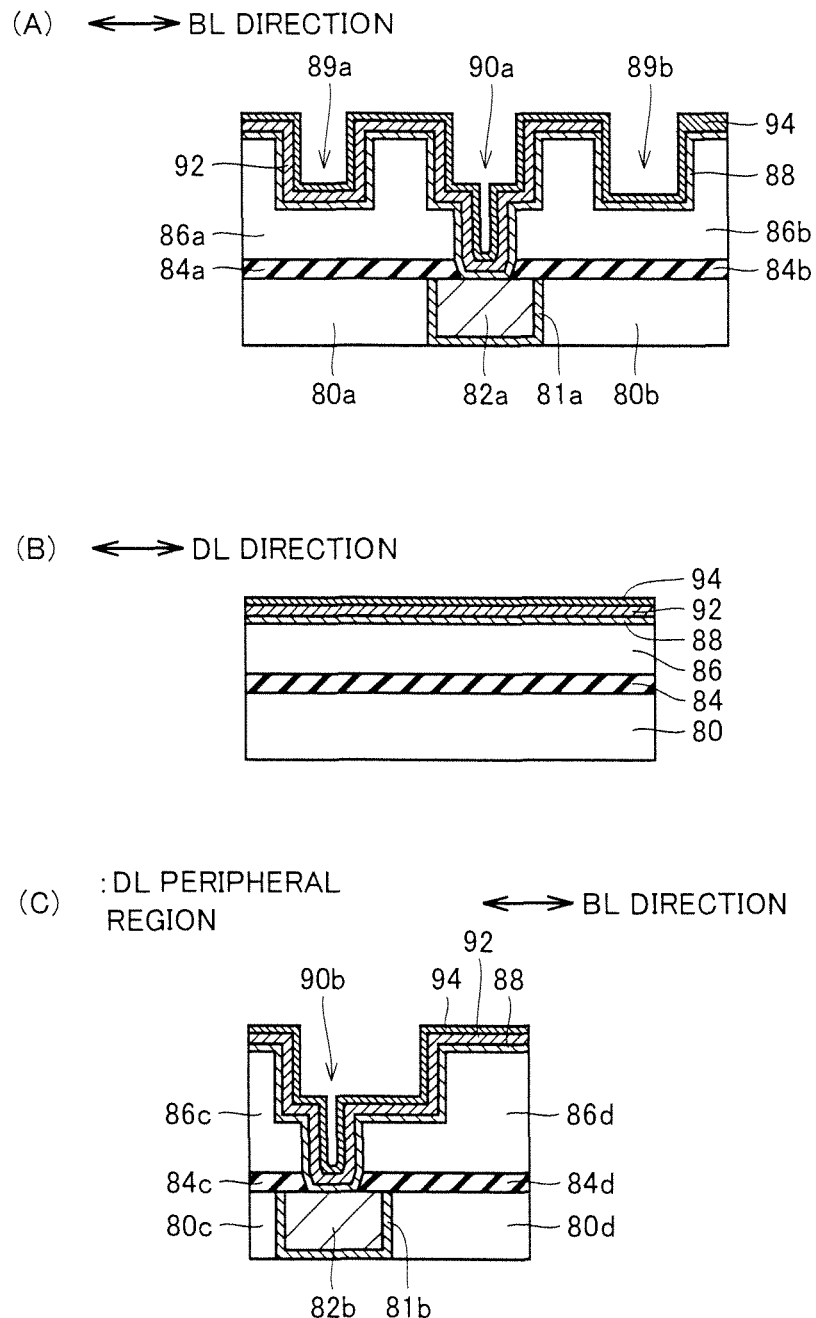
FIGS. 28(A) to 28(C) show a structure in cross section for a step subsequent to the step shown in FIG. 27.
Figure 35:
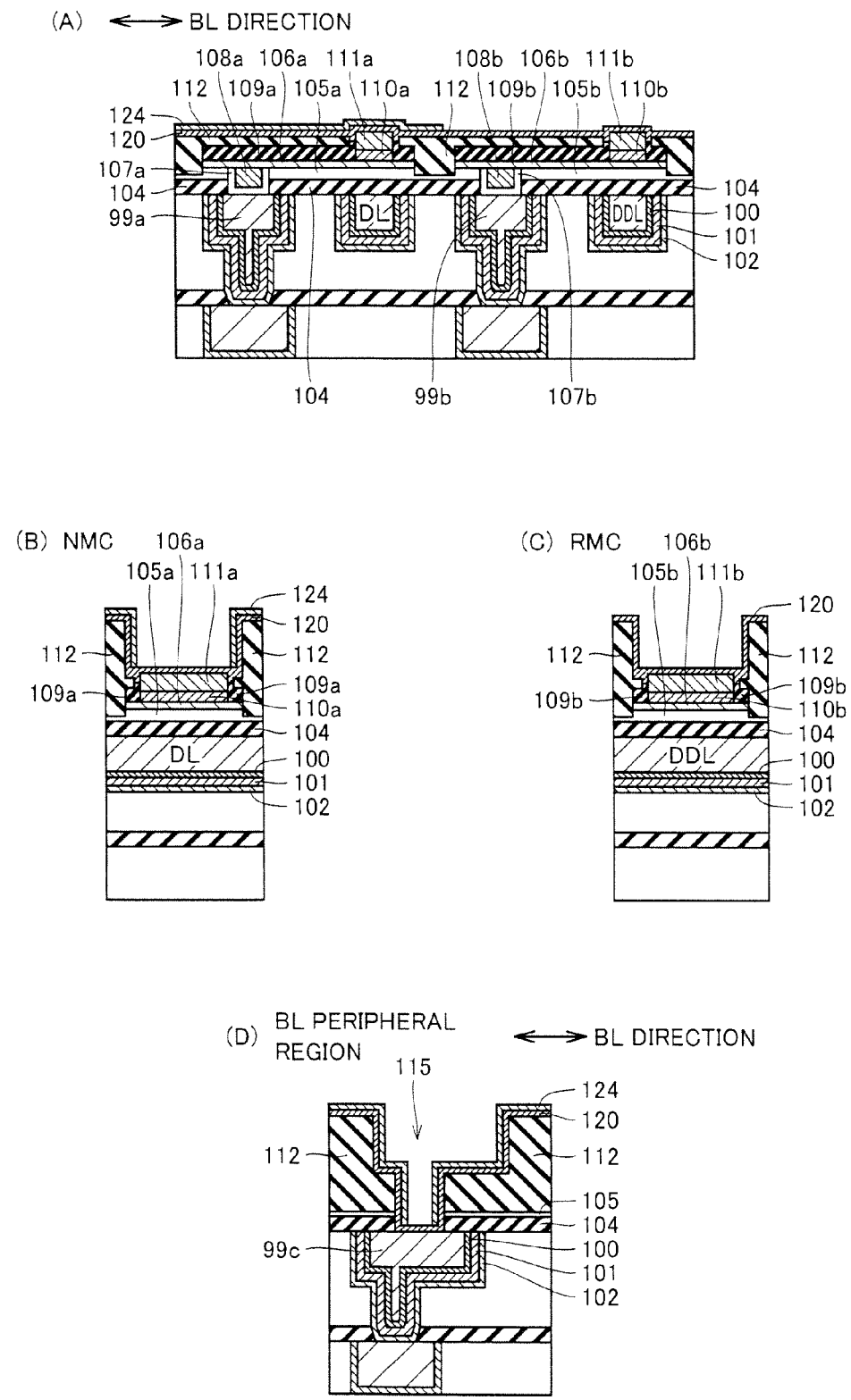
FIGS. 35(A) to 35(D) schematically show structures in cross section of the portions associated with the bit line in a step subsequent to the step shown in FIG. 34.
Figure 42:
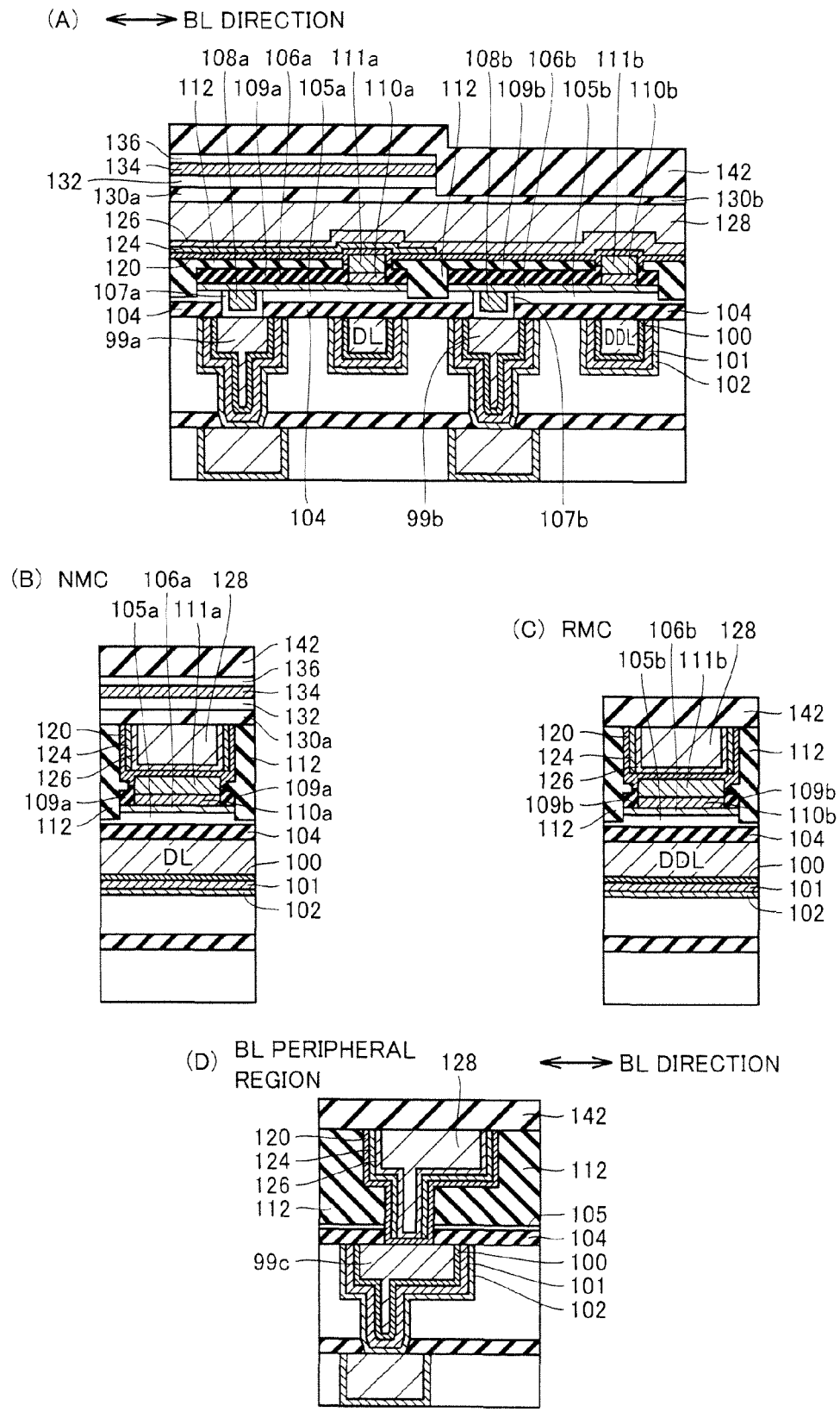
FIGS. 42(A) to 42(D) schematically show structures in cross section of the portions associated with the bit line in a step subsequent to the step shown in FIG. 41.

FIGS. 28(A) to 28(C) show structures in cross section in a step subsequent to that shown in FIGS. 27(A) to 27(C), respectively. In the structures of FIGS. 28(A) to 28(C), barrier film (Ta or TaN film) 94 is again deposited through sputtering or plasma CVD over the entire surface of a copper interconnect formation region. Barrier film 94 is provided for example to prevent copper diffusion of an overlying copper interconnect.

FIGS. 29(A) to 29(C) schematically show structures in cross section in a step subsequent to that shown in FIGS. 28(A) to 28(C), respectively. As shown in FIGS. 29(A) to 29(C), copper (Cu) is deposited over the entire surface by sputtering or plasma CVD, or electrolytic plating. Thus, a copper interconnect is provided in through hole 90*a* shown in FIG. 29(A) and through hole 90*b* shown in FIG. 29(C) via a multilayer of barrier film 94, high permeability film (or magnetic shield film) 92 and barrier film 88 to reach intermediate plug 82*a* and intermediate interconnect 82*b*. By this damascene process, a conductor layer constructing a digit line and a conductor film constructing a plug are formed in parallel.

Conductor film 96 is formed by the damascene method to be relatively large in thickness to ensure that an electrically conductive material fills up recess regions 89*a* and 89*b* and through holes 90*a* and 90*b* to provide electrical connection.

FIGS. 30(A) to 30(C) schematically show structures in cross section in a step subsequent to that shown in FIGS. 29(A) to 29(C), respectively. In FIGS. 30(A) to 30(C), electrically conductive copper interconnect film 96 deposited on a surface is polished away through chemically mechanically polishing (CMP method) to expose barrier film 94 thereunder and also to planarize the surface. Thus recess regions 89*a* and 89*b* are filled with an electrically conductive material, or copper interconnect films 96*a* and 96*b*, and through hole 90*a* is also filled with a copper interconnect 96*c*. In the digit line DL direction, as shown in FIG. 30(B), flat copper interconnect film 96 having a predetermined thickness is provided. As shown in FIG. 30(C), the peripheral region portion also has through hole 90*b* filled with copper interconnect film 96*d*.

This CMP process is performed with barrier film 94 used as a CMP stopping film to prevent its surficial barrier film 94 from being unnecessarily polished to form copper interconnect film at a required thickness.

FIGS. 31(A) to 31(C) schematically show structures in cross section in a step subsequent to that shown in FIGS. 30(A) to 30(C), respectively. As shown in FIGS. 31(A) to 31(C), barrier film 94, high permeability film (or magnetic shield film) 92 and barrier film 88 exposed on a surface are polished away through CMP method. Thus, recess region 89*a* has barrier film 88, high permeability film 92 and barrier film 94 formed on the sidewalls and at the bottom and has copper interconnect film 89*a* formed therein.

Through hole 90*a* also has barrier film 88, high permeability film 92 and barrier film 94 formed on the sidewalls and at the bottom and has copper interconnect film 96*c* formed therein. In contrast, recess region 89*b* has barrier film 88 and barrier film 94 formed on the sidewalls and at the bottom and does not have high permeability film 92 formed therefor.

The electrically conductive layer of recess region 89*a* is utilized as digit line DL to which a normal cell is connected, and conductor layer 96b and barrier films 88 and 94 provided in recess region 89b form dummy digit line DDL to which a reference cell is connected. Thus, dummy digit line DDL is formed into an unclad interconnect structure.

As shown in FIG. 31(C), the peripheral circuit region has barrier film 88, high permeability film 92 and barrier film 94 formed in through hole 90b on the sidewalls and at the bottom and has copper interconnect layer 96d formed therein to electrically connect digit line DL to a component of an underlying peripheral circuit.

Dummy digit line DDL in its peripheral region has an interconnect structure foamed without high permeability film 92. This CMP process planarizes a surface and electrically isolates adjacent digit lines.

Thus, by using a mask, digit line DL to which a normal cell is connected can be formed into a clad interconnect structure and dummy digit line DDL to which a reference cell is connected can be formed into an unclad interconnect structure, and a digit line current induced magnetic field can be reduced in intensity at dummy digit line DDL.

When dummy digit line DDL and digit line DL are provided, dummy digit line DDL is constantly held in the nonselected state in actual use when normal data reading and writing is performed. Accordingly, dummy digit line DDL may also be formed into a clad interconnect structure.

Furthermore, when a normal cell (NMC) and a reference cell (RMC) are connected to a common digit line DL, then, in the digit line direction, a mask is used to prevent high permeability film from being formed in a region provided with the reference cell. More specifically, in the FIG. 27(B) cross sectional structure, in the DL direction, a digit line of a region to which the reference cell is connected is masked to form high permeability film 92 only in a region provided with the normal cell.

Process for Fabricating Partially Clad Interconnect Structure for Bit Line

FIGS. 32(A) to 32(D) schematically show structure in cross section of a semiconductor device in a fabrication process in forming a partially clad interconnect structure for a bit line. FIG. 32(A) shows a cross sectional structure of a memory cell (normal cell and reference cell) formation region as seen in the BL direction. FIGS. 32(B) and 32(C) show a normal cell and reference cell RMC, respectively, in cross section, and FIG. 32(D) shows a portion of a peripheral region for bit line BL in cross section.

In FIG. 32(A), the fabrication process described in FIG. 26 to FIG. 31 is employed to form digit line DL and dummy digit line DDL and intermediate plugs 99a and 99b. Digit line DL and dummy digit line DDL, and intermediate plugs 99a and 99b are provided with a barrier layer 100, high permeability film (or magnetic shield film) 101 and barrier film 102. In FIG. 32(A), to simplify the figure, the barrier and high permeability films for dummy digit line DDL are accompanied by reference numerals. However, in contrast to the FIGS. 27-31 structures, dummy digit line DDL is formed into a clad interconnect structure and provided with high permeability film 101. Dummy digit line DDL only has a reference cell electromagnetically coupled therewith and dummy digit line DDL formed into the clad interconnect structure does not cause a problem in particular.

Copper diffusion prevention film 104 is formed on digit line DL, dummy digit line DDL and intermediate plugs 99a and 99b. Copper diffusion prevention film 104 has a through hole formed on intermediate plugs 99a and 99b and the through hole is provided with barrier films 107a and 107b. Electrically conductive layers 108a and 108b are provided on barrier films 107a and 107b, respectively. Interlayer insulation films 105a and 105b are provided on copper diffusion prevention film 104.

On electrically conductive layers 108a and 108b and interlayer insulation films 105a and 105b, local interconnects 106a and 106b, respectively, are provided for example by sputtering or plasma CVD. Local interconnects 106a and 106b are electrically connected to barrier films 107a and 107b and to electrically conductive layers 108a and 108b.

Copper diffusion prevention films 109a and 109b are formed for example by sputtering in a region excluding variable magnetoresistive elements 110a and 110b on local interconnects 106a and 106b, respectively.

Electrically conductive films (vias) 111a and 111b are formed on the top electrodes (not shown) of variable magnetoresistive elements 110a and 110b for electrical contact with a bit line. Diffusion prevention films 109a and 109b are formed on local interconnects 106a and 106b and external to a region provided with variable magnetoresistive elements 110a and 110b. An element isolation region 112 is formed on copper diffusion prevention films 109a and 109b and interlayer insulation films 105a and 105b by sputtering, CVD or the like.

As shown in FIGS. 32(B) and 32(C), identical structures are applied to normal cell NMC and reference cell RMC, respectively; barrier film 100, high permeability film 101 and barrier film 102 are provided under digit line DL and dummy digit line DDL, and diffusion prevention film 104 is provided on these films. Interlayer insulation films 105a and 105b are formed on diffusion prevention film 104 and local interconnects 106a and 106b are formed on interlayer insulation films 105a and 105b. Variable magnetoresistive elements 110a and 110b are formed on local interconnects 106a and 106b and contacts 111a and 111b are formed on variable magnetoresistive elements 110a and 110b. This variable magnetoresistive element formation region is surrounded by element isolation region 112.

As shown in FIG. 32(D), bit line BL peripheral region (or end portion) has an intermediate interconnect 99c formed on the same interconnect layer as the digit line (through the damascene process), and copper diffusion prevention film 104, interlayer insulation film 105 and element isolation region 112 are successively formed. Under intermediate interconnect 99c, barrier film 102, high permeability film 101 and barrier film 100 are formed, and intermediate interconnect 99c is electrically connected to an underlying interconnect.

Element isolation region 112 is provided with a through hole 115 reaching intermediate interconnect 99c. Intermediate interconnect 99c is connected through an underlying interconnect to a transistor (a bit line write driver or a read gate) providing a transistor of a peripheral circuit of bit line BL.

Digit line DL and dummy digit line DDL are formed through a process similar to that shown in FIGS. 26-31. (It should be noted, however, that dummy digit line DDL is also provided with high permeability film.) This high permeability film is formed to dummy digit line DDL as follows: Simply, in forming the high permeability film, dummy digit line DDL is non-masked, and digit line DL and dummy digit line DDL undergo sputtering forming the high permeability film.

FIGS. 33(A) to 33(D) schematically show structures in cross section after a step subsequent to that shown in FIGS. 32(A) to 32(D), respectively. As shown in FIGS. 33(A) to 33(D), sputtering or plasma CVD is employed to form barrier film 120 formed of tantalum (Ta) film or tantalum nitride (TaN) film and subsequently barrier film 120 is patterned only at a region required. FIGS. 33(A) to 33(D) show this barrier film formed over the entire surface.

As has been set forth above, barrier film 120 has a function to prevent diffusion of copper and also has a function of forming an electrical contact precisely, and, as shown in FIG. 33(D), the bit line BL peripheral region also has electrically connected to intermediate interconnect 99c barrier film 120 of through hole 115 formed on a surface of element isolation region 112.

FIGS. 34(A) to 34(D) schematically show structures in cross section after a step subsequent to that shown in FIGS. 33(A) to 33(D), respectively. As shown in FIGS. 34(A) and 34(C), a region to be provided with reference cell RMC is provided with a mask 122 and furthermore, as shown in FIGS. 34(A), 34(B) and 34(D), a region to be provided with a normal cell and the bit line peripheral region are non-masked to have their surfaces exposed.

In this state, high permeability film of nickel ferrite (NiFe) is deposited by plasma CVD or sputtering. After the high permeability film is deposited, mask 122 is removed.

Accordingly, as shown in FIGS. 35(A) to 35(D) showing each portion in cross section after the mask is removed, the normal cell NMC and the bit line peripheral region are provided with high permeability film (or magnetic shield film) 124 and the reference cell RMC region is not provided with high permeability film (or magnetic shield film). Subsequently, the bit line formation region is anisotropically etched with the reference cell RMC region masked, and a region in which a bit line is formed for a normal cell has high permeability film 124 formed at the bottom etched away. Thus, high permeability film 124 is provided on the side walls and upper surface of barrier film 120 in the normal cell NMC arranging region and bit line peripheral region, and high permeability film 124 is not provided at the bottom surface of barrier film 120 formed at the bottom of the bit line formation region for the reference cell. Magnetic shield layer is thus not provided at the bottom surface of the bit line facing variable magnetoresistive element 110a of the normal cell.

Then, as shown in FIGS. 36(A) to 36(D), tantalum (Ta) film or tantalum nitride (TaN) film is deposited on the copper interconnect formation region by sputtering or the like and the film is patterned into a predetermined geometry to be formed in a required region. Barrier film 126 is thus formed in a region to be provided with a copper interconnect.

Then, as shown in FIGS. 37(A) to 37(D), a so-called dual damascene process is performed: Sputtering is performed to form a copper interconnect seed film and electrolytic plating is subsequently performed to increase a copper interconnect in thickness. Subsequently, a heat treatment (or annealing) is performed to improve the film quality. Thus, as shown in FIGS. 37(A) to 37(D), a thick copper interconnect film 128 is formed in the copper interconnect formation region, i.e., a trench formation region.

Then, CPM process is applied to thin copper interconnect film 128 to a predetermined thickness and also to planarize the surface.

After this copper CMP process is applied, then, as shown in FIGS. 38(A) to 38(D), normal cell NMC, reference cell RMC and the bit line peripheral region have an exposed portion of barrier film 126, high permeability film 124 and barrier film 120 successively chemically and mechanically polished (CMPed) to remove films exposed on the surface and electrically isolate adjacent memory cells and adjacent bit lines. Barrier films 120, 126 and high permeability film 124 are provided on the sidewalls and bottom of copper interconnect film (or conductor) 128 constructing a bit line except the reference cell region. For reference cell RMC, copper interconnect film 128 has sidewalls and a bottom provided only with barrier films 126 and 120, as shown in FIG. 38(C).

The dual damascene process allows a copper interconnect to be used to pattern an interconnect and fill a via. Accordingly, high permeability film is provided on the bit line at three surfaces other than a lower portion to magnetically shield the three direction other than the bottom surface of a bit line for normal cell NMC. In this state, for reference cell RMC, a side surface of the bit line may be provided with magnetic shield film. Thereafter, high permeability film and barrier film are formed above the bit line. The process for forming the high permeability film above the bit line will be described later.

As set forth above, when the high permeability film is provided, the reference cell RMC formation region is masked and only the normal cell and peripheral regions are provided with the high permeability film. Thus a bit line for reference cell RMC can have a partially clad or unclad interconnect structure. Not only reference cell RMC but the peripheral region may also be masked to prevent the formation of the high permeability film thereon.

Second Process for Fabricating a Clad Interconnect Structure for Bit Line

FIGS. 39(A) to 39(D) illustrate a step in cross section for fabricating a clad interconnect structure for a bit line. The step shown in FIGS. 39(A) to 39(D) is performed after that shown in FIGS. 38(A) to 38(D), respectively. Accordingly, the portions corresponding to the components shown in FIGS. 38(A) to 38(D) are identically denoted and will not be described duplicately.

However, for reference cell RMC shown in FIG. 39(C) copper interconnect film 128 for constructing a bit line has a clad interconnect structure, and barrier film 120, high permeability film 124 and barrier film 126 are formed in a region excluding an upper portion of copper interconnect film 128. In other words, the bit line copper interconnect is formed to reference cell RMC through the same process steps as those for a normal cell. In this reference cell region the bit line may have an unclad interconnect structure as shown in FIG. 38.

In the structures shown in FIGS. 39(A) to 39(D), after copper interconnect film 128 is formed, sputtering or plasma CVD is applied to form copper diffusion prevention film 130 on top of copper interconnect film 128 at low temperature. Copper diffusion prevention film 130 is for example silicon nitride (SiN) film. The low temperature process is applied for the following reason: as copper interconnect film 128 has been formed, the low temperature process is performed to prevent copper atoms of the copper interconnect from thermally diffusing into the copper diffusion prevention film during the heat treatment to impair the function of preventing diffusion of copper atoms.

Barrier film 132, high permeability film 134 and barrier film 136 are successively deposited on copper diffusion prevention film 130 by sputtering or the like. On barrier film 136, low temperature silicon nitride film 138 is again formed. These films 130, 132, 134, 136, 138 provide a layered structure, which is patterned to correspond to a region having a copper interconnect thereunder. The regions for normal cell NMC and reference cell RMC are also provided with high permeability film 134 over copper interconnect film 128.

Then, as shown in FIGS. 40(A) and 40(B), resist film 140 is formed in a region for forming normal cell NMC. In contract, as shown in FIGS. 40(C) and 40(D), reference cell RMC region and the peripheral region are not provided with resist film 140. Resist film 140 is used as a mask to etch away copper diffusion prevention film 130 formed of low temperature silicon nitride film. Thereafter again resist film 140 is used as a mask to etch away barrier film 136. Subsequently, resist film 140 is for example plasma-ashed and removed, and thereafter, the resist residue is washed away.

After resist film 140 is removed, then, as shown in FIGS. 41(A) to 41(D), copper diffusion prevention film 138 formed of low temperature silicon nitride film is used as a mask to perform selective etching. As shown in FIG. 41(C), in reference cell RMC, barrier film 136 has been etched away in the previous etching using resist mask 140. As shown in FIGS. 41(A) and 41(C), this selective etching removes high permeability film 134 and underlying barrier film 132 in reference cell RMC. At the time, in the reference cell RMC region, copper diffusion prevention film 130 is partially etched away and reduced in thickness to be copper diffusion prevention film 130b.

In the normal cell NMC region, as shown in FIGS. 41(A) and 41(B), copper diffusion prevention film 138 is reduced in thickness (by the selective etching step) to be copper diffusion prevention film 138a. In the peripheral region, as well as the reference cell RMC region, thin diffusion prevention film 130b remains on the surface, as shown in FIG. 41(D).

This series of steps forms is bit line BL into a partially clad interconnect structure in which bit line BL has a lid, or high permeability film 134 serving as a lid at the upper portion etched away and has high permeability film 124 only at the sidewalls in the reference cell RMC formation region.

Then, as shown in FIGS. 42(A) to 42(D), copper diffusion prevention film 142 is formed over the entire surface through a low temperature process (i.e., low temperature SiN film is formed). Thus a bit line fabrication process completes, and the film thickness is measured. If the measured film thickness is a normal value, then the wafer's back surface is cleaned to prevent copper atoms or etching residue from remaining on the semiconductor wafer down to a subsequent process to negatively affect the subsequent process. Then, mist jet is employed for cleaning to remove particles produced through the bit line fabrication process for ensuring reliability.

In this case, there is a possibility that since the bit line portion provided with reference cell RMC does not have high permeability film 134 serving as a lid, a step may be formed at the low temperature barrier film (or the low temperature SiN film) between the memory cell formation region and the reference cell formation region. If this step cause a problem, CMP is applied to provide a flat surface.

Thus the process for forming the high permeability film (or magnetic shield film) that serves as the lid requires the process step of etching away the magnetic shield film serving as an overlying lid for the reference cell after the magnetic shield film is once formed at an overlying layer. Alternatively, however, while masking the reference cell RMC formation region, barrier film 132, high permeability film 134, and barrier film 136 may be formed in the normal cell region and the peripheral region with. High permeability film 134 is not formed for the bit line in the reference cell region as the region is masked.

Thus a bit line interconnect structure can be formed into a partially clad or unclad interconnect structure in a reference cell region and into a (full) clad interconnect structure in a normal cell region to allow a reference cell to hold storage data reliably for a long term.

Fifth Embodiment

Figure 43:
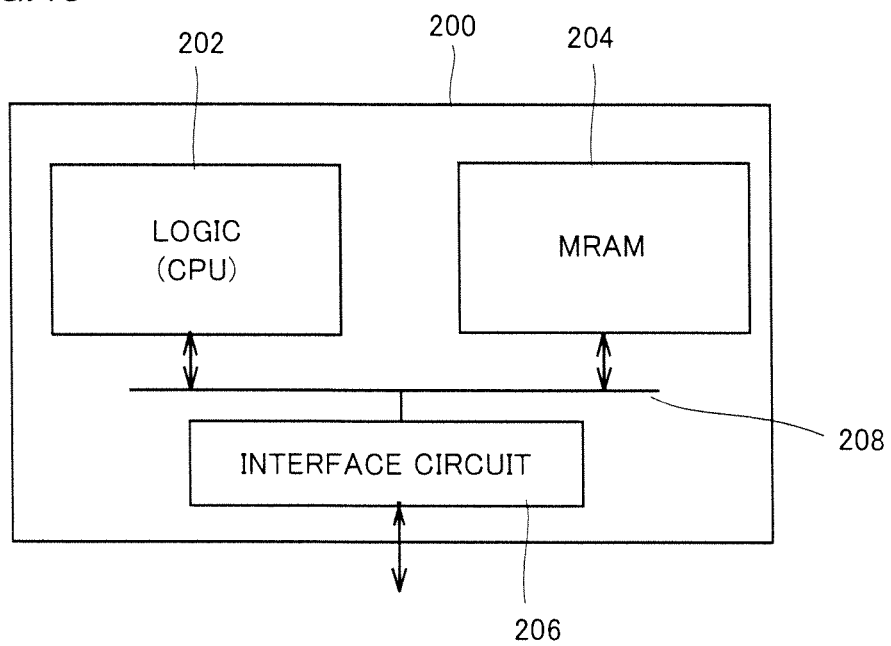
FIG. 43 schematically shows one example of a configuration of a system LSI including an MRAM according to the present invention.

FIG. 43 shows schematically an overall configuration of a semiconductor device according to a fifth embodiment of the present invention. In FIG. 43, a semiconductor device 200 includes a logic 202, an MRAM 204 provided on the same semiconductor substrate (or chip) as logic 202, and an interface circuit 206 externally communicating data/signals.

Logic 202 is configured for example of a processor such as a central processing unit (CPU) and follows a program or an instruction to perform a designated operational process. MRAM 204 is similar in configuration to the MRAM described previously, and is used to store external data and/or data used by logic 202 and also as a working area when logic 202 performs a data operation process. Logic 202 is coupled with MRAM 204 via an internal bus 208 and can access MRAM 204 via internal bus 208.

Interface circuit 206 is coupled with logic 202 and MRAM 204 via internal bus 208, and communicates signals and data between an external device and logic 202 and transfers data to and from MRAM 204. For example, when semiconductor device 200 is used as a controller for mobile equipment, downloaded application data or the like is stored in MRAM 204.

The FIG. 43 semiconductor device 200 is a so-called system LSI and configures a single system, and MRAM 204 is arranged as a single macro block using a library. When such an MRAM for embedded application is implemented through the use of MRAM according to the present embodiment, it can hold and read data stably for a long term, and a stable system can be implemented.

INDUSTRIAL APPLICABILITY

A magnetic semiconductor memory allowing data to be read stably for a long term can be implemented by applying the present invention to a magnetic semiconductor memory in which a variable magnetoresistive element has a resistance value set in accordance with a direction of magnetic moment (or of magnetization) of a free layer set by a current induced magnetic field. In particular, a significantly stable system can be constituted by applying the present invention to a system-on-chip (SOC) constituting a system, rather than a single chip memory device.

REFERENCE CHARACTERS LIST

1: semiconductor device; 2a, 2b: memory mat; 3: row decoder; 4a, 4b: column decoder; SRY00-SRY03, SRY30-SRY33: subarray, memory cell array; 11a, 11b: bit line write driver; 12: word line driver; 13: digit line driver; 25: bit line; VR: variable magnetoresistive element; FRL: free layer; FXL: fixed layer; BRL: barrier layer; MC1, MC2: memory cell; ATR1, ATR2: access transistor; VR1, VR2, VR: variable magnetoresistive element; WL0, WL1 . . . : word line; DWL0, DWL1: dummy word line; DL0, DL: digit line; DDL: dummy digit line; SL: source line; RMC0-RMC3: reference cell; 10N: normal cell array region; 10R: reference cell array region; 40: clad interconnect structure; 42: partially clad or unclad interconnect structure; DVR: dummy variable magnetoresistive element; 30: conductor; 32: magnetic shield film; 32a, 32b, 32c: magnetic shield film; 10F1, 10F2, 10F3: dummy cell region; PQ1, PQ2: peripheral circuit region; 10F4-10F7: dummy cell region; 10NA, 10NB: normal cell region; 50: memory cell array; 52: word line drive circuit; 54: digit line drive circuit; 56a, 56b: hit line write driver; 60: clad interconnect structure; 62: partially clad or unclad interconnect structure; LA, DLA: local interconnect; 65: conductor; 67, 67a-67c: magnetic shield film; HAX: hard axis of magnetization; EAX: easy axis of magnetization; 88: barrier film; 92: magnetic shield film; 94: barrier film; 96: digit line conductor interconnect; 96a, 96b: digit line conductor interconnect; 110a, 110b: variable magnetoresistive element; 111a, 111b: contact (conductor film); 120: barrier film; 124: magnetic shield film; 126: barrier film; 128: bit line conductor interconnect; 132, 136: barrier film; 138: high permeability film; 200: semiconductor device; 202: logic, 204: MRAM.

The invention claimed is:

1. A semiconductor device comprising:
a memory cell array having a plurality of normal magnetic memory cells disposed in rows and columns, and a plurality of reference cells aligned with said normal magnetic memory cells in a direction of one of a row of the normal magnetic memory cells and a column of the normal magnetic memory cells for generating a reference current in reading data from the normal magnetic memory cell; and
a plurality of first writing magnetic field supply lines arranged corresponding to one of said rows and said columns of the normal magnetic memory cells, and inducing and applying, in data writing, a data writing magnetic field by a current to corresponding ones of the normal magnetic memory cells and the reference cells, each said first writing magnetic field supply line having a clad interconnect structure for said normal magnetic memory cells other than the reference cell of one of a corresponding one of the row and the column and a partially clad or unclad interconnect structure for the reference cell of said corresponding one, said clad interconnect structure being a structure in which a conductor is covered with a high permeability film except a surface of said conductor facing corresponding normal cells, said partially clad or unclad interconnect structure being a structure in which a surface of said conductor facing corresponding reference cell and at least one additional surface of said conductor are non-covered with said high permeability film.

2. The semiconductor device according to claim 1, wherein each said first writing magnetic field supply line has a first surface facing the memory cells and the reference cell, a second surface opposite to said first surface, and a side surface, and has the first, second and side surfaces all magnetically non-shielded in a region corresponding to the reference cell.

3. The semiconductor device according to claim 1, wherein each said first writing magnetic field supply line has a first surface facing the memory cells and the reference cell, a second surface opposite to said first surface, and a side surface, and has the first and second surfaces magnetically non-shielded and said side surface covered with said high permeability film in a region corresponding to said reference cell.

4. The semiconductor device according to claim 1, wherein each said first writing magnetic field supply line has a first surface facing the memory cells and the reference cell, a second surface opposite to said first surface, and a side surface, and has the first and side surfaces magnetically non-shielded and said second surface covered with said high permeability film in a region corresponding to said reference cell.

5. The semiconductor device according to claim 1, wherein the reference cells are disposed in a center region of said memory cell array provided with the normal magnetic memory cells.

6. The semiconductor device according to claim 1, wherein the normal magnetic memory cells and the reference cells each include a variable magnetoresistive element including a free layer having a direction of magnetization set in accordance with data stored in an associated cell and a fixed layer having a direction of magnetization fixed regardless of data stored in the associated cell, said free layer having an easy axis of magnetization along which magnetization inversion is easily caused and a hard axis of magnetization along which magnetization inversion is hard to cause, and wherein
the semiconductor device further comprises:
a second writing magnetic field supply line arranged orthogonal to the first writing magnetic field supply line; and
a circuit for supplying a write current to selected first and second writing magnetic field supply lines such that a magnetic field intensity along said hard axis of magnetization is lager than a magnetic field intensity along said easy axis of magnetization, and in data writing, said selected first and second writing magnetic field supply lines generating orthogonal magnetic fields, said orthogonal magnetic fields providing a combined magnetic field setting said direction of magnetization of said free layer of a selected normal magnetic memory cell and said direction of magnetization of said free layer of a selected reference cell to write data.

7. A semiconductor device comprising:
a plurality of magnetic memory cells disposed in rows and columns and including magnetoresistive elements, respectively, each magnetic resistive element having a layered structure including a free layer having a direction of magnetization set in accordance with data stored to an associated memory cell and a fixed layer having a direction of magnetization fixed regardless of data stored to said associated cell;
a plurality of first write current lines, each arranged corresponding to one of a row of the memory cells and a column of the memory cells, for applying a current induced magnetic field to corresponding magnetic memory cells in data writing; and
a plurality of second write current lines, each arranged the other of the row of the memory cells and the column of the memory cells, for applying a current induced magnetic field to corresponding magnetic memory cells in the data writing,
said plurality of first write current lines and said plurality of second write current lines at their respective crossings sandwiching corresponding magnetoresistive elements in between vertically,
said plurality of magnetic memory cells including a normal magnetic memory cell and a reference magnetic memory cell for generating a reference value for determining data in reading data from said normal magnetic memory cell,
said crossings including a first crossing sandwiching the magnetoresistive element of said reference magnetic memory cell and a second crossing sandwiching the magnetoresistive element of said normal magnetic memory cell, a conductor constructing an associated one of the first and second write current lines being covered with a magnetic shield film over a smaller surface area at the first crossing than at said second crossing.

8. The semiconductor device according to claim 7, wherein said plurality of first write current lines and said plurality of second write current lines each have a surface facing a corresponding one of the magnetoresistive elements non-covered with said magnetic shield film.

9. The semiconductor device according to claim 8, wherein said first crossing and said second crossing share the first write current line and have the second write current line formed of different interconnect lines.

10. The semiconductor device according to claim 9, wherein each said first write current line has a first surface facing a corresponding magnetoresistive element, a second surface opposite to said first surface and defining said conductor in thickness with said first surface, and third and fourth surfaces defining said conductor in width, and the first write current line has the first, second and fourth surfaces non-covered with the magnetic shield film at said first crossing and has the third and fourth surfaces covered with said magnetic shield film at said second crossing.

11. The semiconductor device according to claim 10, wherein said different interconnect lines of said second write current line comprises a first line arranged corresponding to said first crossing and covered with the magnetic shield film, and a second line arranged corresponding to said second crossing and non-covered with said magnetic shield film.

12. The semiconductor device according to claim 7, wherein:

said plurality of magnetic memory cells include a plurality of the normal magnetic memory cells;

said plurality of magnetic memory cells also include a plurality of the reference magnetic memory cells sharing said plurality of first write current lines with said plurality of normal magnetic memory cells and aligned with the other of said row of memory cells and said column of memory cells; and between a normal region having said plurality of normal magnetic memory cells arranged therein and a reference region having said plurality of reference magnetic memory cells arranged therein, a geometry dummy memory cell region having geometry dummy cells geometrically identical to the magnetic memory cells arranged therein is provided.

* * * * *